United States Patent [19]
Sotome et al.

[11] Patent Number: 5,761,216
[45] Date of Patent: Jun. 2, 1998

[54] BIT ERROR MEASUREMENT SYSTEM

[75] Inventors: Tetsuo Sotome, Tatebayashi; Takayuki Nakajima, Minamikawara-mura; Kazutaka Osawa, Saitama; Kazuhiro Shimawaki; Kouichi Shiroyama, both of Gyoda, all of Japan

[73] Assignee: Advantest Corp., Tokyo, Japan

[21] Appl. No.: 732,303

[22] PCT Filed: Feb. 22, 1996

[86] PCT No.: PCT/JP96/00405

§ 371 Date: Feb. 10, 1997

§ 102(e) Date: Feb. 10, 1997

[87] PCT Pub. No.: WO96/26451

PCT Pub. Date: Aug. 2, 1996

[30] Foreign Application Priority Data

Feb. 24, 1995 [JP] Japan ................................. 7-061712
Feb. 24, 1995 [JP] Japan ................................. 7-061713
Apr. 4, 1995 [JP] Japan ................................. 7-102956

[51] Int. Cl.$^6$ ................................................ G06F 11/00
[52] U.S. Cl. ............................................... 371/27.1
[58] Field of Search .................... 371/27.1, 27.7, 371/28, 22.1, 5.4

[56] References Cited

FOREIGN PATENT DOCUMENTS

| | | |
|---|---|---|
| 51-78679 | 7/1976 | Japan. |
| 2-69687 | 3/1990 | Japan. |
| 2-201179 | 8/1990 | Japan. |
| 4-95884 | 3/1992 | Japan. |
| 4-100406 | 4/1992 | Japan. |

*Primary Examiner*—Vincent P. Canney
*Attorney, Agent, or Firm*—Muramatsu & Associates

[57] ABSTRACT

A bit error measurement system provides means for generating test patterns, multiplexing means and means for specifying and recording a pattern position. In a first aspect, a bit error measurement system has a pattern generator having M channels of pattern generation and a pattern generation controller 10 for controlling the pattern generation in the M channels so that when one channel is selected to generate a pattern the other channels are controlled to be waiting. In a second aspect, a clock frequency difference detector 150 is provided for counting a frequency of an input clock 111 and comparing the results with the frequency at the time of previous switching to detect whether the frequency change is greater than a predetermined value to judge whether the system is in a measurement state and to permit or prohibit a switching operation of a clock switch circuit. In a third aspect, a pattern position recording part 210 is provided to store pattern position information of a reference pattern generator 262 when an error detection signal $265_a$ is received from a comparator 265.

11 Claims, 15 Drawing Sheets 5,761,216

BIT ERROR MEASUREMENT SYSTEM

TECHNICAL FIELD

This invention relates to a bit error measurement system for testing a bit error rate, and more particularly, firstly, to a bit error measurement system which has a bit error test pattern generator and a bit error measurement apparatus for analyzing bit error rates of an output signal from a device under test by interchangeably switching between specific patterns and random patterns in real time. Secondly, this invention relates to a bit error test pattern generator which automatically switches clock edges of a multiplexing clock signal to be used for generating a high speed pattern by sequentially multiplexing parallel patterns generated by a pattern generator. Thirdly, this invention relates to a bit error measurement system which is able to specify and record positions of the pattern that involved in bit errors.

BACKGROUND ART

A first example of a conventional technology is show in the following.

Namely, a bit error test pattern generator/bit error measurement apparatus in the conventional technology is described below in which a test pattern is generated by interchanging specific patterns and random pattern in real time to analyze bit errors in the output signal from a device under test.

In a bit error measurement system, a test pattern of test speed up to several 10 GHz is applied to a device under test DUT, and performance of the DUT is analyzed by measuring a bit error rate while changing the test conditions.

In the conventional bit error measurement system, a test pattern to be given to the DUT is generated in either one of the two forms. One is a pseudo random binary sequence (PRBS) pattern generation and the other is a word pattern generation in which contents of a memory are repeatedly generated. This test pattern is supplied to the DUT, and the resultant outputs of the DUT is compared with expected pattern signals. The number of bit errors is counted and an error rate is calculated and displayed.

FIG. 5 shows an example of a test arrangement for a bit error measurement system. A test pattern signal $71_{pat}$ and a clock signal 73 from a pattern generator 71 are provided to a DUT 74. The resultant output from the DUT 74 which is a signal 61 to be measured and a clock signal 60 are provided to a bit error measurement apparatus 75 whereby a bit error is measured.

FIG. 6 shows an internal structure of the pattern generator 71. For generating a test pattern to be supplied to the DUT 74, the pattern generator 71 includes a PRBS generator $71_{prbs}$ which generates a PRBS (pseudo random binary sequence) pattern, and a WORD generator $71_{word}$ which generates a word pattern based on the contents of a memory. Either one of the patterns is fixedly selected by a multiplexer (MUX) $71_m$ and is provided with a desired amplitude and offset voltage by a buffer amplifier $71_{buf}$. Then the test pattern is applied to the DUT 74. The contents of the memory and other conditions for the pattern generation are set in advance through an external CPU (computer) to satisfy the desired test conditions.

In receiving the test pattern signal, the DUT shown in FIG. 5 outputs pattern data, which for example, may be the same data received as input data, to the bit error measurement apparatus 75. The bit error measurement apparatus 75 receives the output data from the DUT 74 and compares the data with expected pattern internally generated and counts the number of bits which do not match with one another, calculates a bit error rate, and displays the results.

FIG. 7 shows an internal structure of the bit error measurement apparatus 75. The received signal 61 that is to be measured is compared, by a comparator 65, with a reference pattern from a reference pattern generator 62. The number of bits which do not match with one another are counted by an error counter 70.

Since the position of the pattern sequence in the received signal 61 to be tested from the DUT 74 and the position of the bit sequence from the reference pattern generator 62 are undefined, the measurement apparatus includes a pattern synchronization part 66 for synchronizing pattern positions of both of the bit sequence. A synchronization detection counter $66_a$ in the pattern synchronization part 66 is to detect whether the error rate is less than a predetermined value. For example, the synchronization detection counter $66_a$ counts the number of mismatch bits $65_{err}$ for a fixed clock time period (for example, for a period of 16,384 clock pulses). A comparison test pulse $66_{tst}$ is given to a comparator $66_c$ whereby the counted number of mismatch and a threshold value are compared. At the same time, the synchronization detection counter $66_a$ is reset to an initial value to repeat the above detection procedure.

If the results of the comparison is greater than the threshold value from a threshold value register $66_b$, it is considered that the position of the both bit sequence is still not aligned. Thus, a clock mask signal 67 is provided to the reference pattern generator 62 to suspend the pattern generation for one clock time so as to shift the bit sequence.

This operation for the pattern synchronization detection is repeated for every fixed clock period while shifting the bit sequence by one clock time until the pattern sequence coincide with each other. When the coincidence in the pattern sequence is detected, it is deemed that both of the patterns are synchronized and thus the operation for the synchronization detection is finished and an actual bit error measurement is undertaken.

With respect to the internal structure of the reference pattern generator 62, the two generators, the PRBS generator $62_{prbs}$ and the word generator $62_{word}$ are identical to the generators in the test pattern generator 71 except for the clock mask function where the pattern is shifted by one clock time as noted above. The same type of the pattern generator now used in the pattern generator 71 is set in the reference pattern generator to generate the reference pattern $62_{pat}$ which is supplied to the comparator 65.

The above noted various data in the measurement system, the synchronization conditions, the measurement conditions and the like are set in advance through an external CPU to meet the desired test requirements.

The second example of the conventional technology is described below.

This example relates to a bit error measurement system of the conventional technology which produces a high speed test pattern by sequentially multiplexing parallel patterns generated by a pattern generator. In this bit error measurement system, edges of a clock signal for multiplexing the patterns are automatically switched.

FIG. 11 shows a configuration of this wide band pulse pattern generator. The pulse pattern generator is mainly used to measure a bit error rate of a device under test (DUT) by providing the pulse pattern to the DUT.

The pattern generator is formed of a pattern generation circuit 113, multiplexing circuits $114_1$–$114_n$, an intermediate retiming circuit 127, ½ divider circuits $112_1$–$112_n$, delay circuits $115_1$–$115_n$ and $115_r$, a clock switching circuit 128, and an approach detection circuit 131.

An input clock 111 is an externally given clock signal having unknown clock rates. The frequency of the input clock 111 extends in a wide range, for example from 50 MHz to 10 GHz which is freely set by a user in advance. However, the clock rate of the clock 111 must be constant when measuring the bit error of the DUT.

Since it is necessary to correctly multiplex and retime the patterns for any clock rates of this wide range input clock 111, the pattern generator includes the delay circuits $115_1$–$115_n$ for providing delay times ($\tau_0$, $\tau_0+\tau_1$, $\tau_0+\tau_1+\tau_2$... $\tau_0+\tau_1+..+\tau_{m-1}$, $\tau_m$, $\tau_{m+}..+\tau_{n-1}$, $\tau_{m+}..+\tau_n$) to the clock signal equivalent to the delay times caused by propagation delays in the circuit components and wiring between the pattern generation circuit 113 and multiplexing circuits. In such a circuit arrangement, in the past, it is necessary for the delay circuits to have longer delay times in the later stages. Further, high quality clock with less jitters is required since the pattern generator operates in high speed. However, the circuit of FIG. 11 alleviates this requirements by having the intermediate retiming circuit 127, the clock switching circuit 128, and the approach detection circuit 131 to cancel the delay times ($\tau_0+\tau_1+..+\tau_{m-1}$) in the prior stages.

The brief explanation is given in the following regarding the operations concerning the intermediate retiming circuit 127, the clock switching circuit 128, and the approach detection circuit 131. The more detailed description is shown in Japanese patent application Ser. No. 218454-1990.

The approach detection circuit 131 is formed of a coincidence circuit 132, an average circuit 133, a comparator 134 and a T-type flip-flop 135.

It is stated in the Japanese patent application Ser. No. 218454-1990 that when a retiming clock for the intermediate retiming circuit 127 approaches too close to a transition point of the input pattern to the retiming circuit 127, a correct retiming will not be available. Thus, the Japanese patent application states, that when the retiming clock and the pattern transition point are too close with each other, that situation is detected by the approach detection circuit 131. Based on the detection signal, a phase of the clock, which is provided to the divider circuits to control the multiplexing operation, is switched. As a result, the delay times ($\tau_0+\tau_1+..+\tau_{m-1}$) in the prior stages are canceled by the foregoing operation.

When adjusting the clock rate conditions, the clock switching circuit 128 switches to a clock phase which is more stably retiming the patterns. During the measurement, the input clock rate must be constant, and thus the clock switching must not be taken place. This is because if the clock switching operation is taken place, it is not possible to test the bit error.

The third example of the conventional technology is described in the following.

This example relates to a bit error measurement system of conventional technology which specifies and records a position of a pattern where a bit error is produced.

FIG. 17 shows an example of test arrangements in which a bit error measurement system is used. For testing a device 274, a test pattern signal 272 and a clock signal 273 from a pattern generator 271 are provided to the device under test 274. The resultant output from the device under test 274 which is a signal 261 to be measured and a clock signal 260 are provided to a bit error measurement apparatus 275 whereby a bit error is measured. In this situation, it is necessary to measure the bit error by setting the test pattern 272 and a reference pattern generated by the bit error measurement apparatus 275 identical with one another.

When the test speed is extremely high, 10 GHz for example, the device under test 274 may generate an abnormal serial pattern at the timing when the operation of the device under test is unstable. The bit error measurement system analyzes such pattern conditions that have caused the bit error.

Here, a serial process of the bit error measurement is shown in the following.

FIG. 18(a) is a block diagram of a conventional bit error measurement apparatus for explaining the process of bit error measurement. The bit error measurement apparatus is formed of a reference pattern generator 262, a comparator 265, an error counter 270, a pattern synchronization part 266. The pattern synchronization part 266 is provided for synchronizing patterns between the signal 261 to be measured and the reference pattern generator 262. The pattern synchronization part 266 is formed of a synchronization detection counter $266_a$, a threshold value register $266_b$, and a comparator $266_c$.

The pattern synchronization within in this context means that even if bit errors exist to a certain extent in the unknown signal 261 to be measured, synchronization is deemed to be established. In other words, if the error rate is lower than a certain level such as shown in the threshold register $266_b$, it is deemed to be synchronized. The synchronization detection counter $266_a$ is a counter which counts the number of bit errors for every predetermined time period. After the predetermined time period, the counted value and the data from the threshold register $266_b$ are compared by the comparator $266_c$. When the comparator $266_c$ detects that the number of bit errors is less than the threshold value, a clock mask signal 267 is no longer generated therefrom.

The reference pattern generator 262, when receiving the clock mask signal 267, delays the output phase of the reference pattern signal $262_a$ by one bit to generate the next reference pattern. This process is continued consecutively until the reference pattern 262a matches with the input signal 261 to be measured. When the reference pattern $262_a$ matches with the input signal, the clock mask signal 267 from the comparator $266_c$ is no longer generated, and thus, the reference pattern $262_a$ is maintained in the synchronized situation. In this manner, a pattern synchronization is established between the signal 261 to be measured and the reference pattern generator 262.

Thereafter, under this synchronization situation, the real bit error measurement is carried out.

The comparator 265 compares the signal under test 261 for every bit, and detects the resultant bit errors. The error counter 270 counts up the bit errors. The counted value is read by the CPU at every predetermined time period to calculate the error rate, and the number of errors will be output, for example, by means of a display.

Here, a parallel process of the bit error measurement is shown in the following.

FIG. 18(b) is a block diagram showing an example of a conventional bit error measurement apparatus for a parallel process. In this case, an ultra high speed signal 261 to be measured is converted to a low speed parallel signal before the measurement. The bit error measurement apparatus is formed of a demultiplexes (DEMUX) 264, a reference pattern generator 262, a divider 263, a comparator 265, an error counter 270 and a pattern synchronization part 266.

As in the foregoing explanation, the pattern synchronization part 266 generates a clock mask signal when the synchronization state is not reached. The divider 263, in receiving the clock mask signal, suspends a divided clock $263_a$ by one bit. The DEMUX 264 receives the divided clock $263_a$, and will not fetch the input signal to be measured when the divided clock $263_a$ is suspended. The reference pattern generator maintains the reference pattern $262_a$ when the divided clock $263_a$ is suspended. Therefore, a phase difference between a signal under test at the comparator 265 which is an output signal $264_a$ of the DEMUX and the reference pattern signal $262_a$ shifts corresponding to the time (one bit) during which the divided clock $263_a$ is suspended. The relationship between the DEMUX output $264_a$ and the reference pattern signal $262_a$ in this situation is shown in FIG. 19.

By repeating this process, the synchronization is established.

After reaching the synchronization, the real bit error measurement is initiated. Since this example operates in a 16-bit parallel manner, the error counter 270 is formed of 16 counters each of which corresponds to one of the 16 bits. The CPU reads the number of errors in the 16 counters and adds the results to display the same.

Three problems exist in the conventional technology in the above to be solved by the present invention, which are as follows:

First, as shown in the bit error measurement system which can specify the pattern position which caused the bit errors, the conventional bit error measurement system selects and generates either one of the word pattern generator or the PRBS pattern generator. Although the PRBS pattern generator can generate a long period pattern, it is not able to generate a specified bit sequence. On the other hand, although the word pattern generator can generate a desired bit sequence, it is not able to generate a long period pattern since there is a limit in the capacity of the memory.

As a consequence, it is not possible to fully test communication devices by generating a mixed test pattern of a long period and pseudo random pattern which is similar to transmission frames (such as STM, SDH, ATM) in an actual communication network. Thus, the conventional bit error measurement system is not appropriate for evaluating this type of communication devices.

Second, as noted above, in the conventional bit error measurement system which includes the bit error pattern generator which is able to automatically switch clock edges of the clock signal to sequentially multiplex the parallel patterns to form the high speed test pattern, the approach detection circuit 131 is constantly in operation even when the system is in the bit error measurement process. This means that the approach detection circuit 131 detects such an approach between the retiming clock and the pattern transition point which is caused by minor changes in the clock rate of the input clock which is produced by temperatures changes and the like. In such a situation of the clock rate changes, in most cases, the multiplexing operation of the patterns is performed properly. Nevertheless, the clock phase is switched in such a situation in the conventional technology.

This clock switch causes the bit stream of the output test pattern an instant indeterminate state. This indeterminate state in the pattern increases unstable parameters in the bit error measurement and may adversely affect the measurement, which is not proper to fully use the measurement system.

Third, as noted above with respect to the bit error measurement system which specifies and records the position of the test pattern which caused the bit errors, the error information acquired by the error counter 270 is not enough to fully analyze and specify the real cause of the error in the signal under test. To do this, in the conventional technology, the contents of the test pattern, i.e., the contents in the pattern generator 271 and the reference pattern generator 262 have been changed in various manners to see corresponding changes in the bit errors, such as increase or decrease. In this manner, the causes of the bit errors such as pattern conditions, pattern categories are identified.

As has been foregoing, the error counter 270 is sufficient to find the bit errors but is not sufficient to fully analyze and specify the pattern conditions which caused the bit errors, which is inconvenient in the use of the bit error measurement system.

Therefore, there are three objects of the present invention as follow. First, it is an object of the present invention to provide a bit error measurement system which is capable of multiplexing and generating specified bit sequence patterns and long period random patterns so that the bit error measurement is available based on this test patterns. Second, it is an object of the present invention to provide a bit error measurement system which is capable of allowing or inhibiting the operation of the clock switch circuit 128 based on whether the measurement system is in the measurement process or not by monitoring the clock rate of the clock 111. Thus, it is able to provide a stable, wide band pulse pattern generator which can suppress the unstable operation based on the clock switching. Third, it is an object of the present invention to provide a bit error measurement system which facilitates the error analysis for the bit errors by recording the address information of the reference pattern generator 262 so as to identify the position of the reference pattern in which the bit error is detected. Thus, the pattern position which produced the bit errors are easily identified and thus the error analysis for finding the cause of the error is performed more easily.

DISCLOSURE OF THE INVENTION

The solution of the above noted problems in accordance with the first invention is described below.

This invention includes a bit error test pattern generator/bit error measurement apparatus which is able to switch between specific patterns and random patterns in real time and analyze the bit errors in the output signal from the device under test.

FIG. 1 is a block diagram showing a first solution by the first invention.

To solve the above noted problems, the first invention includes a pattern generator having M channels of pattern generation. The channels of pattern generation are sequentially switched in real time. A pattern generation controller 10 is provided to control the pattern generator so that while one channel of the pattern generator is selected to output the test pattern, the operation of the other channel of the pattern generator is controlled.

As a result, a test pattern generator to be used in a bit error measurement is established which has M channels pattern generator where each of the channels selectively outputs the test pattern.

In case where the channel M is 2, the pattern generation controller 10, which selects the pattern generator in real time, includes a program counter (PGC) 12 which repeatedly generates a frame period $12_{pser}$. In receiving frame period data $12_{dat}$ from the PGC counter 12, a coincidence detector 14 generates detection signal which is provide to two state means (such as an SR flip-flop) which generates a select signal $16_{sel}$ for switching between time periods for multiplexing the two channels of the pattern generator. The pattern generation controller 10 also includes a period counter 18 which provides the number of frames during which the patterns will be repeatedly generated.

FIG. 2 is a block diagram showing a second solution by the first invention.

To solve the above noted problem, the configuration of the bit error measurement apparatus includes a pattern generator having M channels of pattern generation corresponding to a received pattern signal 61 to be tested which has the M selective patterns. The pattern generator generates a select signal corresponding to each of the patterns in the received signal 61 to be tested. Each of the M channels of the pattern generator is sequentially switched by this select signal and the selected pattern is provided to a comparator 65. When one channel of the test pattern is output, the other channel of the test pattern is controlled by a pattern generation controller 10. A multiplexing means is provided which receives the select signal from the pattern generation controller 10 and sequentially switches M channel output patterns from the pattern generator and provides the selected pattern to the comparator 65. The bit error measurement apparatus further includes an M channel pattern synchronization part which detects synchronization of patterns for each channel when receiving the select signal from the pattern generation controller 10. When detecting that the patterns compared are not in the synchronization state, the M channel pattern synchronization part sends a clock mask signal to the corresponding pattern generator.

Therefore, the bit error measurement apparatus is established which generates M channel selective patterns and provides the selected patterns to the comparator to be compared with the signal to be measured and thus measures the bit errors in the received signal.

The bit error measurement system is thus established which has the above noted bit error pattern generator and the bit error measurement apparatus in which the M channel selective patterns are selectively provided to the device to be tested by the bit error pattern generator and the resultant output signal from the device under test is received and the bit error is measured by the bit error measurement apparatus.

As a more specific example, the pattern generator of the present invention preferably includes at least one channel of word pattern generator or at least one channel of PRBS pattern generator. There are two pattern generation modes, one is a word generator $71_{word}$ which generates a word pattern by reading the contents in a memory and a PRBS generation mode $71_{prbs}$ which generates a pseudo random pattern.

The bit error measurement system which is able to specify the position of the pattern which caused the bit error functions as follows:

(1) When M=2, the pattern generation controller 10 in the bit error pattern generator 20 controls to alternately switch two pattern generators in real time. Both of the PRBS pattern generator and the word pattern generator generate the pattern while only one of them being selected to output the pattern. Alternatively, while one pattern generator is generating the pattern, the other pattern generator's operation is suspended.

(2) Similarly, the pattern generation controller 10 in the bit error measurement apparatus controls to provide the test patterns to the comparator 65.

(3) The reference pattern generator 34 generates the patterns for the comparison which are the same as the patterns generated by the test pattern generators in the bit error test pattern generator 20. By receiving each clock mask signal from the word pattern synchronization part 31 and the PRBS pattern synchronization part 32, test patterns are generated which are in synchronism with the received signal 61 when the apparatus is in the synchronization state.

(4) The word pattern synchronization part 31 receives the select signal $16_{sel}$ from the pattern generation controller 10, and determines whether the patterns are in the synchronization state in a period $T_{oh}$ for generating a word pattern. If the error rate is greater than a predetermined value, the word pattern synchronization part provides a clock mask signal $31_{inh}$ to the word pattern generator $62_{word}$ so as to bring the word pattern into the synchronization state.

(5) Similarly, the PRBS pattern synchronization part 32 receives the select signal $16_{sel}$ from the pattern generation controller 10, and determines whether the patterns are in the synchronization state in a period $T_{payload}$ for generating a PRBS pattern. If the error rate is greater than a predetermined value, the word pattern synchronization part provides a clock mask signal $32_{inh}$ to the PRBS pattern generator $62_{prbs}$ so as to bring the word pattern into the synchronization state. Namely, both of the pattern synchronization parts are able to separately, i.e., independently between the word pattern and the PRBS pattern, synchronize the pattern.

The solution of the problems in accordance with the second invention is shown in the following:

This invention relates to a bit error measurement system which includes a bit error pattern generator which is able to automatically switch clock edges of the clock signals to sequentially multiplex parallel patterns to form a high speed test pattern.

FIG. 8 is a circuit diagram showing the second invention.

To solve the above noted problems, the error bit test pattern generator of the present invention includes a clock frequency difference detector 150 which measures the frequency of an input clock 111 and compares the measured frequency with a frequency value at the time of the previous phase switch to detect whether the frequency change exceeds a predetermined frequency difference. By this detection signal, it is determined whether the apparatus is in the measurement state or the adjustment state and controls either to allow or prohibit the phase switch operation of a clock switch circuit 128.

Accordingly, a wide range pulse pattern generator is realized in which parallel patterns generated by a pattern generator 113 are sequentially multiplexed to generate a high speed pattern. The pulse pattern generator has an approach detection circuit 131 and a clock switch circuit 128 and an intermediate retiming circuit 127 for canceling the delay times $((\tau_0+\tau_1+..+\tau_{m-1})$ in the multiplexing circuits in the prior stages of the intermediate retiming circuit 127 by automatically changing the clock edges. The wide range pulse pattern generator of the present invention avoids the unstable operation in the measurement state of the bit error measurement system.

In the frequency difference detector 150, means for measuring a frequency $f_{clk}$ is provided for comparing the frequency $f_{clk}$ and a previous frequency $156_{old}$. The frequency difference detector 150 further includes means for prohibiting and allowing the switching operation of the clock switch circuit 128. If the detected frequency difference is greater than a predetermined value, it is determined that the measurement system is in the adjustment state and thus allows the clock switch circuit 128 its automatic switching operation. In contrast, when the frequency difference is smaller than the predetermined value, it is deemed that the system is in the measurement state and thus prohibits the clock switch circuit 128 its automatic switching operation. The frequency difference detector 150 also includes means for holding the frequency value $156_{old}$ which is a frequency when the clock phase is automatically switched to other clock phase.

As a specific example, the frequency difference detector 150, as shown in FIG. 9, is formed of a reference gate time generator 152, a pulser 153, a frequency counter 154, a count value latch register 156, a subtractor 158, a comparator 159, flip-flops 160, 161, an exclusive NOR (EXNOR) gate 162 and an AND gate 163.

The clock frequency difference detector 150 counts the frequency of the input clock 111 and compares the counted value with the previous frequency value. If the present frequency is greater than the previous frequency by a predetermined value, the frequency difference detector 150 allows/prohibits the clock switch circuit 128 its clock phase switching operation.

By an AND gate 170 and the frequency difference detector 150, it is determined whether the system is in the adjustment state or the measurement state. If the system is in the measurement state, the clock switching operation of the clock switch circuit 128 is prohibited. Therefore, the unstable operation of the clock switch circuit 128 during the measurement state is eliminated.

The solution of the problems by the third invention is shown in the following:

This invention relates to a bit error measurement apparatus which is capable of specifying a position of the test pattern which has been involved in the bit error.

FIG. 12 is a block diagram showing a first embodiment of the third invention.

To solve the problem, the invention of FIG. 12 includes a pattern position recording part 210 which stores the information regarding the position of the reference pattern generation of a reference pattern generator 262 in a memory 220 when a comparator 265 sends a error detection signal $265_a$.

The bit error measurement apparatus, in addition to the pattern position recording part 210, the reference pattern generator 262 and the comparator 265, further includes a pattern synchronization part 266, an error counter 270 to specify the position of reference pattern generator 262 which corresponds to the error in the input signal 261 to be measured.

FIG. 15 is a block diagram showing a second embodiment of the third invention.

To solve the problem, the invention of FIG. 15 includes a pattern position recording part 230 which stores the information regarding the position of the reference pattern generation of the reference pattern generator 262 in a memory 220 when it received either one of N bit error detection signals $265_b$ from a comparator 265. The memory 220 stores both the reference pattern position information and the error detection signal $265_b$.

By this arrangement, when measuring the bit error of the input signal 261 to be measured in a N bit parallel form, the position of the error produced in the input signal 261 can be specified as a pattern position in the reference pattern generator 262.

The reference pattern generator is either a word pattern generator or a PRBS pattern generator. Alternatively, the pattern generator includes both the word pattern generator and the PRBS pattern generator.

BEST MODE FOR CARRYING OUT THE INVENTION

The embodiment of the first invention will be explained in the following.

Namely, a bit error test pattern generator/bit error measurement apparatus is described below in which a test pattern is generated by interchanging in real time a specific pattern and a random pattern and errors are analyzed in the output signal from a device under test.

In this embodiment, test patterns are generated by switching in real time a PRBS pattern generator which generates a long period random pattern and a word pattern generator which generates a specified bit sequence. Pattern synchronization is established for the patterns generated by the pattern generators as above and bit errors are measured. This embodiment is further explained with respect to an example of a SDH (synchronous digital hierarchy) frame structure.

Figure 3:
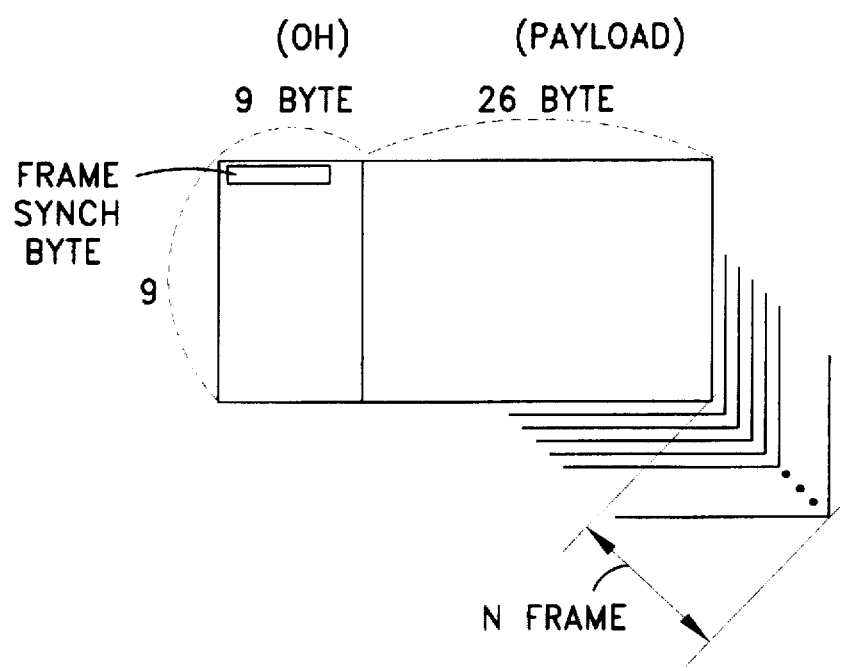
FIG. 3 is a schematic diagram showing a frame structure of SDH (STM-1) which is an example of communication frame concerning the first invention.

As shown in the SDH frame structure of FIG. 3, one frame is formed of 9 lines with 270 byte length. First nine byte out of 270 bite length is an overhead (OH) and the remaining 261 byte is a payload. It is assumed in the following that, test patterns for testing this frame structure, it is necessary to provide a known test pattern for the position of the overhead and a random pattern for the position of the payload. A test pattern generator generates the frame pattern by repeating N frame periods. Namely, for every frame period, the same bit stream is generated for the overhead while the random bit stream is generated for the payload.

Figure 1:
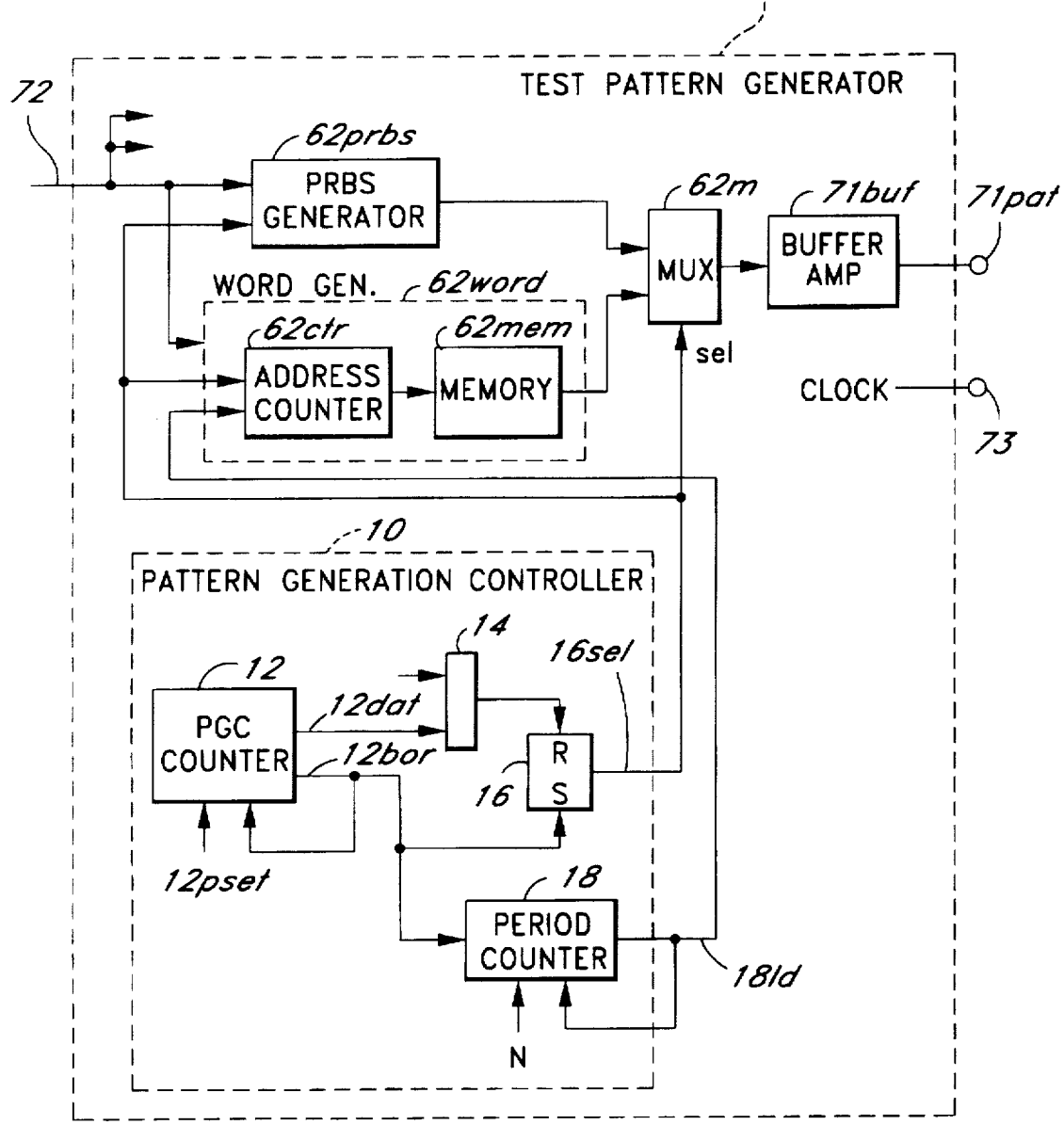
FIG. 1 is a block diagram showing a bit error test pattern generator according to the first invention.

For generating this type of test patterns, a bit error test pattern generator of the present invention includes a pattern generation controller 10 as shown in FIG. 1 in addition to the conventional structural components. A PRBS generator $62_{prbs}$, a word generator $62_{word}$, a multiplexer (MUX) $62_m$, and a buffer amplifier $62_{buf}$ are basically the same as that in the conventional technology. However, each of the PRBS generator $62_{prbs}$ and the word generator $62_{word}$ has a function of suspending the pattern generation.

The pattern generation controller 10 is formed of a program counter 12, a coincidence comparator 14, a set-reset flip-flop (SRFF) 16, and a period counter 18.

The program counter 12 is a counter for down counting by repeatedly presetting the frame period $12_{pset}$ for every borrow signal $12_{bor}$. The program counter 12 generates predetermined frame period data $12_{dat}$ by counting a clock signal 72. The frame period $12_{pset}$ is set by an external CPU to meet with desired frame periods.

Figure 4:
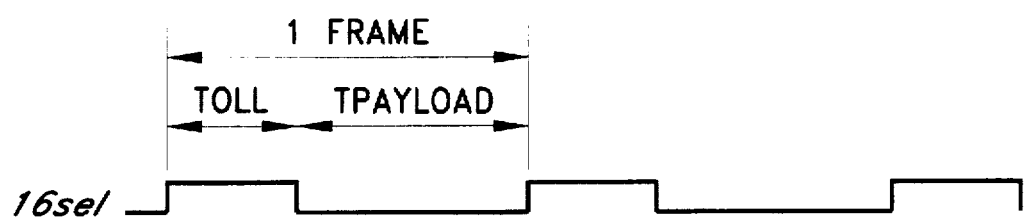
FIG. 4 is a timing chart showing a select signal for multiplexing within one frame period in accordance with the first invention.
Figure 5:
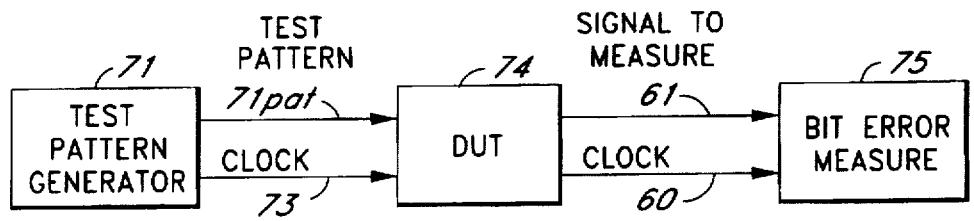
FIG. 5 shows an example of a test arrangement for a bit error measurement system.
Figure 6:
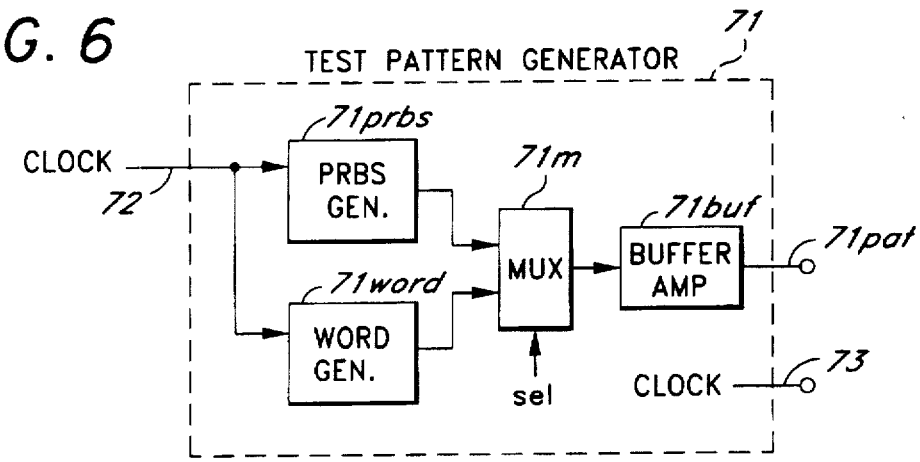
FIG. 6 is a block diagram showing a structure of a conventional bit error test pattern generator concerning the first invention.
Figure 7:
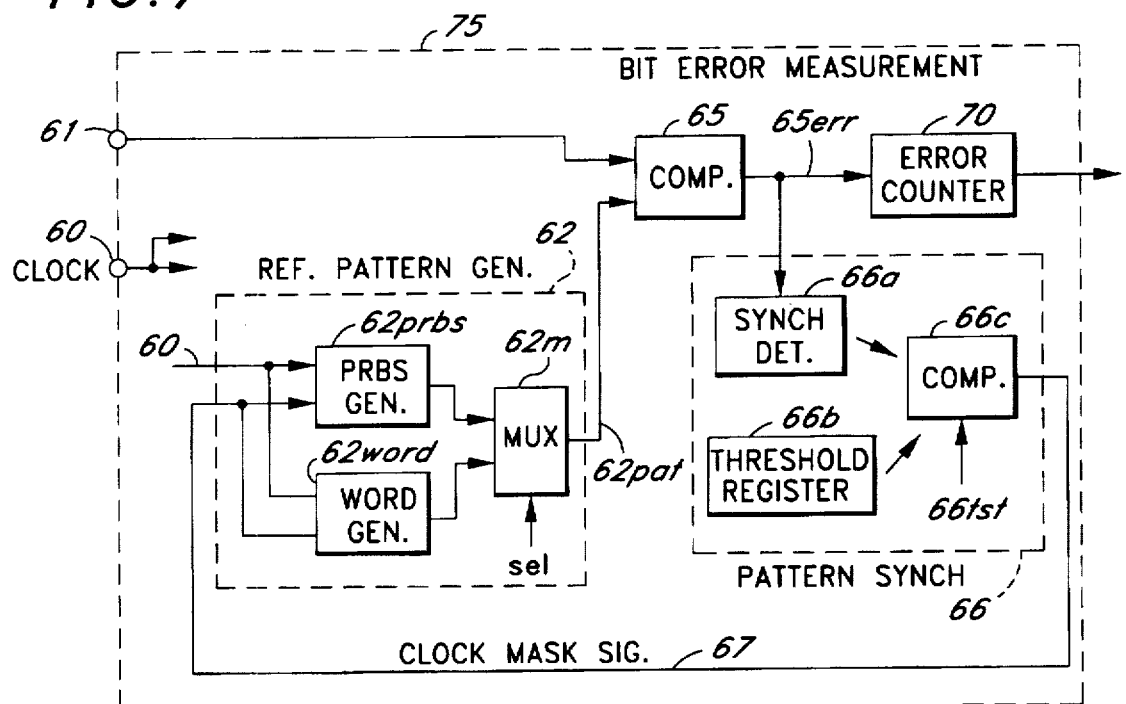
FIG. 7 is a block diagram showing a structure of a conventional bit error measurement apparatus for a received signal concerning the first invention.

The set reset flip-flop (SRFF) 16 produces a select signal as shown in FIG. 4 which switches two pattern generators in a frame period. When receiving the frame period data $12_{dat}$ from the program counter 12, the coincidence comparator 14 detects time data for the 9 byte of the overhead OH and changes the set reset flip-flop 16 to a set state.

When receiving the borrow signal $12_{bor}$ from the program counter 12, the set reset flip-flop 16 is changed to a reset state. The select signal $16_{sel}$ thus produced at the output of the flip-flop is provided to the multiplexer $62_m$. The input patterns are multiplexed in real time by the multiplexer $62_m$ and are provided to the buffer amplifier $71_{buf}$. The select signal is also provided to the PRBS generator $62_{prbs}$ and an address counter $62_{ctr}$ in the word generator $62_{word}$ to alternately suspend the pattern generation in the generators.

In this manner, the pattern generator selected by the multiplexer $62_m$ operates while the other pattern generator is in a temporarily waiting state. By alternately repeating this process, the test pattern which is a multiplex of both of the patterns is generated by the pattern generator.

The period counter 18 is to repeat the overhead period for N frame times. The period counter 18 receives the borrow signal $12_{bor}$ from the program counter 12 to count down the contents. By a borrow signal $18_{1d}$ from the counter 18 is provided to a load input of the address counter $62_{ctr}$ to set the counter $62_{ctr}$ to an initial value. The period counter 18 repeats this process by setting itself to an initial value $9 \times N$ by the borrow signal $18_{1d}$. Here, the initial values or the value applied to the coincidence comparator 14 are freely set by the external CPU to form a desired interval of the N frames.

In the following, the bit error measurement apparatus 30 for measuring the received signal 61 which is derived through the device under test when given the test pattern from the above noted test pattern generator 20.

Figure 2:
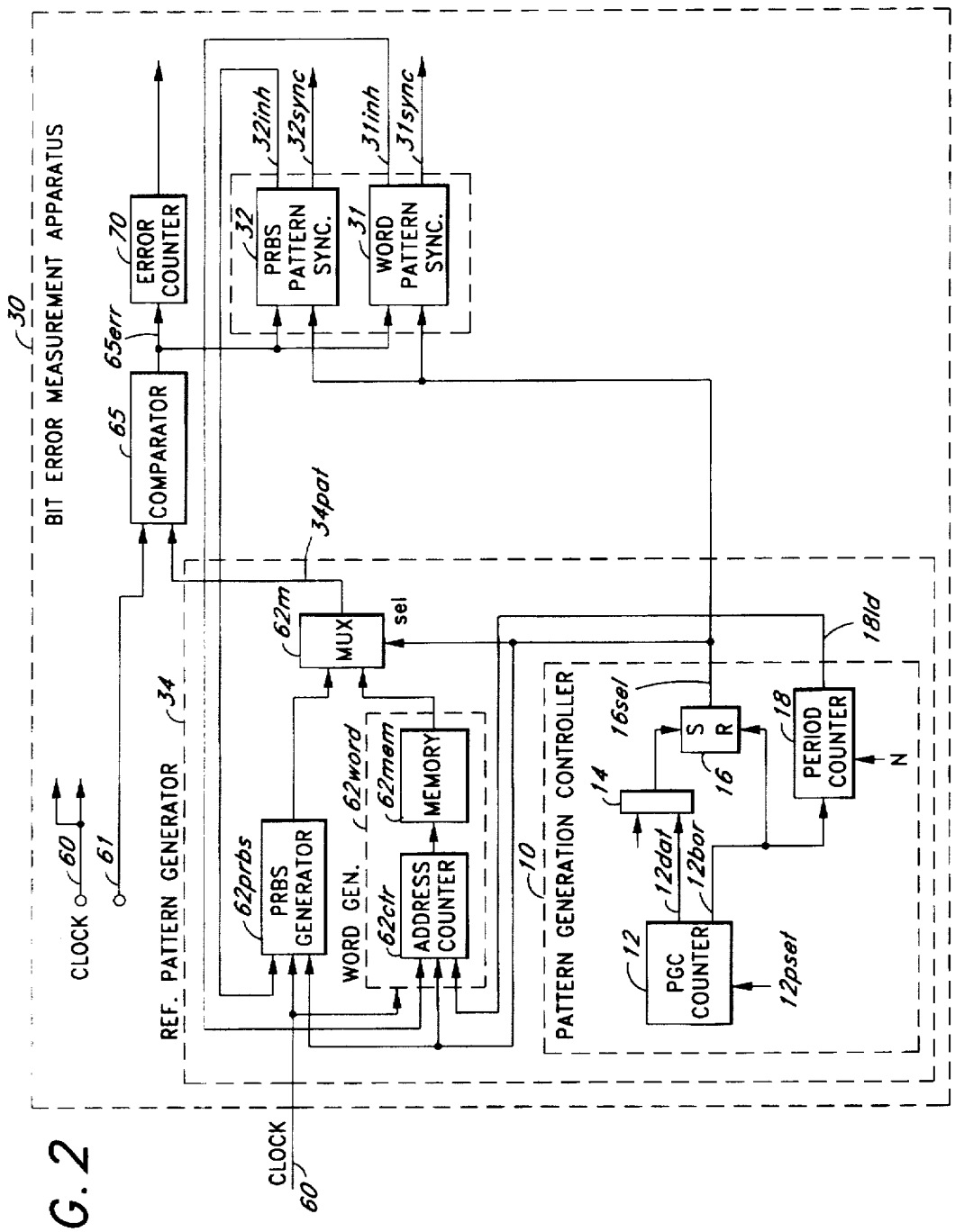
FIG. 2 is a block diagram showing a structure of a bit error rate measurement apparatus for a received signal in accordance with the first invention.

As shown in FIG. 2, the measurement apparatus includes two separate pattern synchronization parts, i.e., a word pattern synchronization part 31 and a PRBS pattern synchronization part 32, and a reference pattern generator 34 which is a multiplexing type pattern generator as in the test pattern generator 20.

Similar to the bit error test pattern generator 20, a pattern generation controller 10 in the reference pattern generator 34 controls to generate a multiplexed pattern signal $34_{pat}$ which is provided to one input terminal of a comparator 65.

The difference in the reference pattern generator from that of the test pattern generator 20 is that, to synchronize with the received signal 61, the word pattern synchronization part 31 and the PRBS pattern synchronization part 32 separately include a clock suspension function (pause function) to suspend the pattern generation for every one clock time. Although the clock suspension function is the same as that in the conventional technology, each of the synchronization parts has an independent suspension function in this invention.

The detections of the pattern synchronization are performed separately and in parallel in the two pattern synchronization parts. When the bit error rates in the both paths are lower than a predetermined value, the measurement system is shift to a real bit error measurement state to actually measures the bit error of the received signal.

One synchronization detection path includes the word pattern synchronization part 31. The word pattern repeats for every N frames. The operation of detecting a synchronization position is different from that of the conventional one in that it operates only in the word detection period $T_{OH}$. Namely, a synchronization detection counter $66_a$ is enabled only during the high level range of the select signal $16_{sel}$ from the pattern generation controller 10. As in the conventional technology, when the error rate is higher than a predetermined value, a clock mask signal $31_{inh}$ is provided to the word pattern generator $62_{word}$ to shift the pattern generation by one clock period. When the error rate reaches the predetermined value, it is deemed that the word pattern reaches the synchronization state and the synchronization detection operation is suspended. Thus, the word pattern synchronization part generates a synchronization detection signal $31_{sync}$.

The other synchronization detection path includes the PRBS pattern synchronization part 31. Similar to the description above, the operation of detecting a synchronization position is performed only during the low level range of the select signal $16_{sel}$ from the pattern generation controller 10. When the error rate is higher than a predetermined value, a clock mask signal $32_{inh}$ is provided to the PRBS pattern generator $62_{prbs}$ to shift the pattern generation by one clock period. When the error rate reaches the predetermined value, it is deemed that the PRBS pattern reaches the synchronization state and the synchronization detection operation is suspended, and as a result, a synchronization detection signal $32_{sync}$ is generated.

After reaching the synchronization states in both of the pattern generators, the system moves to the measurement state to measure a bit error.

As proceeding the foregoing, specified pattern sequence and the long random period pattern are multiplexed to realize a bit error measurement system which is applicable to any desired communication frame structure. It is apparent that the present invention is also applicable to the conventional way of measurement wherein either the word pattern or the PRBS is selected to be output.

Other embodiments of the first invention are shown in the following.

In the foregoing description, the word pattern or the PRBS pattern are one bit pattern generator. However, each of the pattern generators may be formed of M bit parallel pattern generators wherein the outputs are parallel-serial (M-to-1) converted by a multiplexer to form a serial bit stream.

Further, in the foregoing embodiment, the comparator 65 compares the pattern for one bit. However, it is also possible to compare for the unit of M bits by the comparator 65 by including a demultiplexes which serial-parallel (1-to-M) converts the patterns.

Further, in the foregoing embodiment, the test pattern generator is a combination of the word pattern generator and the PRBS pattern generator. However, it is also possible to combine two word pattern generators or two PRBS pattern generators to multiply two specific word patterns or two random patterns.

Furthermore, in the foregoing embodiment, the test pattern generator includes two pattern generators to multiply the patterns therefrom. However, it is also possible to include P (P is more than 2) pattern generators while the surrounding circuits such as pattern synchronization parts are arranged to meet the number of pattern generators.

The embodiment in accordance with the second invention is shown in the following:

This invention relates to a bit error measurement system which includes a bit error pattern generator which is able to automatically switch clock edges of the clock signal to sequentially multiply parallel patterns to form a high speed test pattern.

An example of the embodiment of the present invention includes a function to automatically inhibit the operation in a clock switch circuit 128 by detecting the frequency change in an input clock 111.

Figure 8:
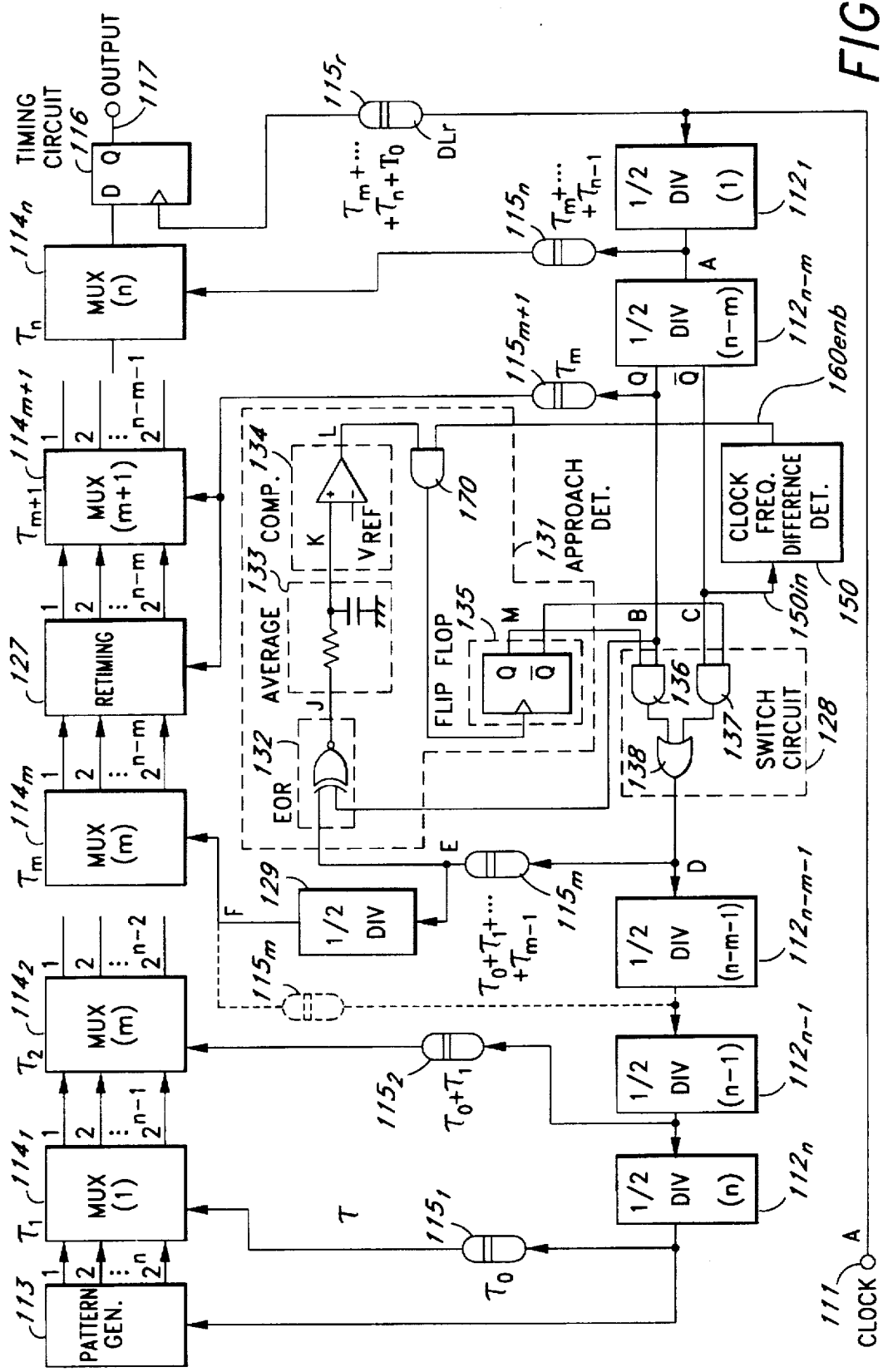
FIG. 8 is a block diagram showing a structure of a wide band pulse pattern generator of the second invention.

As shown in FIG. 8, the structure of a wide band pulse pattern generator additionally includes a clock frequency difference detector 150 and an AND gate 170 to the conventional structure.

The AND gate 170 is connected between the output of a comparator 134 and a clock input of a T flip-flop 135 to prohibit the operation of the T-type flip-flop 135. The clock frequency difference detector 150 receives an intermediate speed clock signal $150_{in}$ which is a clock signal produced by dividing the input clock to detect the frequency changes. The output signal of the clock frequency difference detector 150, i.e., a phase switch enable signal $160_{enb}$, is provided to one input terminal of the AND gate 170 to either allow or prohibit the phase switch operation.

Figure 9:
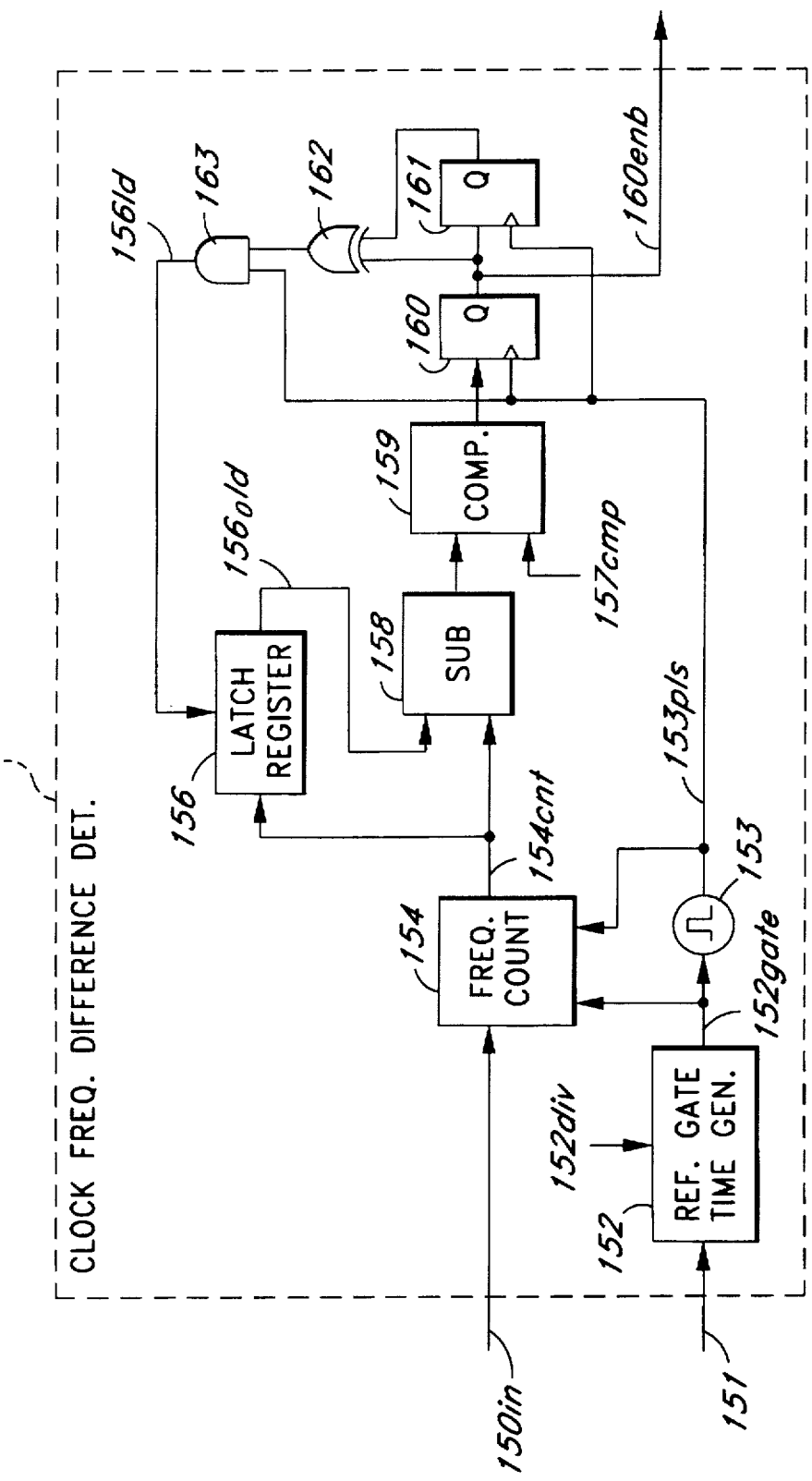
FIG. 9 is a block diagram showing an internal structure of a clock frequency difference detector 150 of the second invention.
Figure 10:
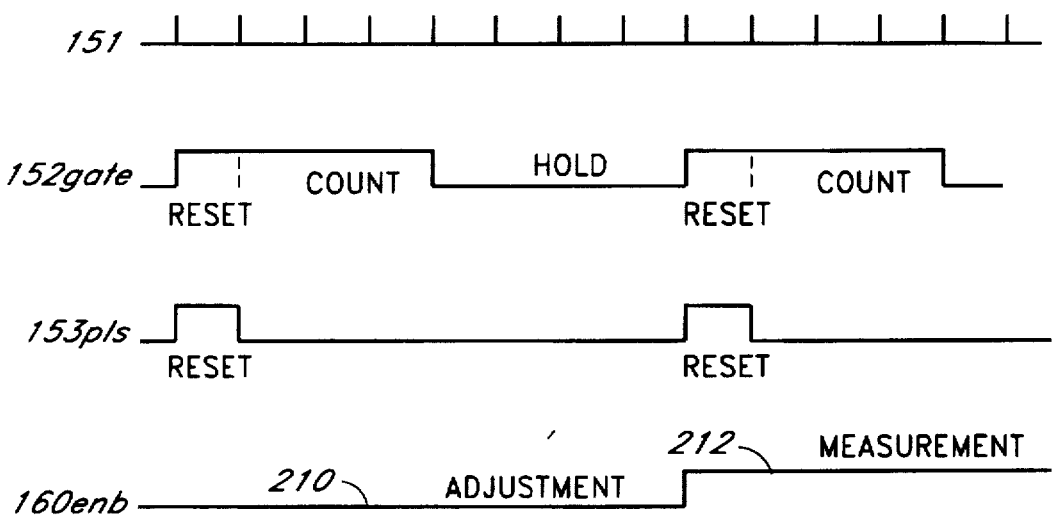
FIG. 10 is a timing chart showing operation timings of the clock frequency difference detector 150 of the second invention.
Figure 11:
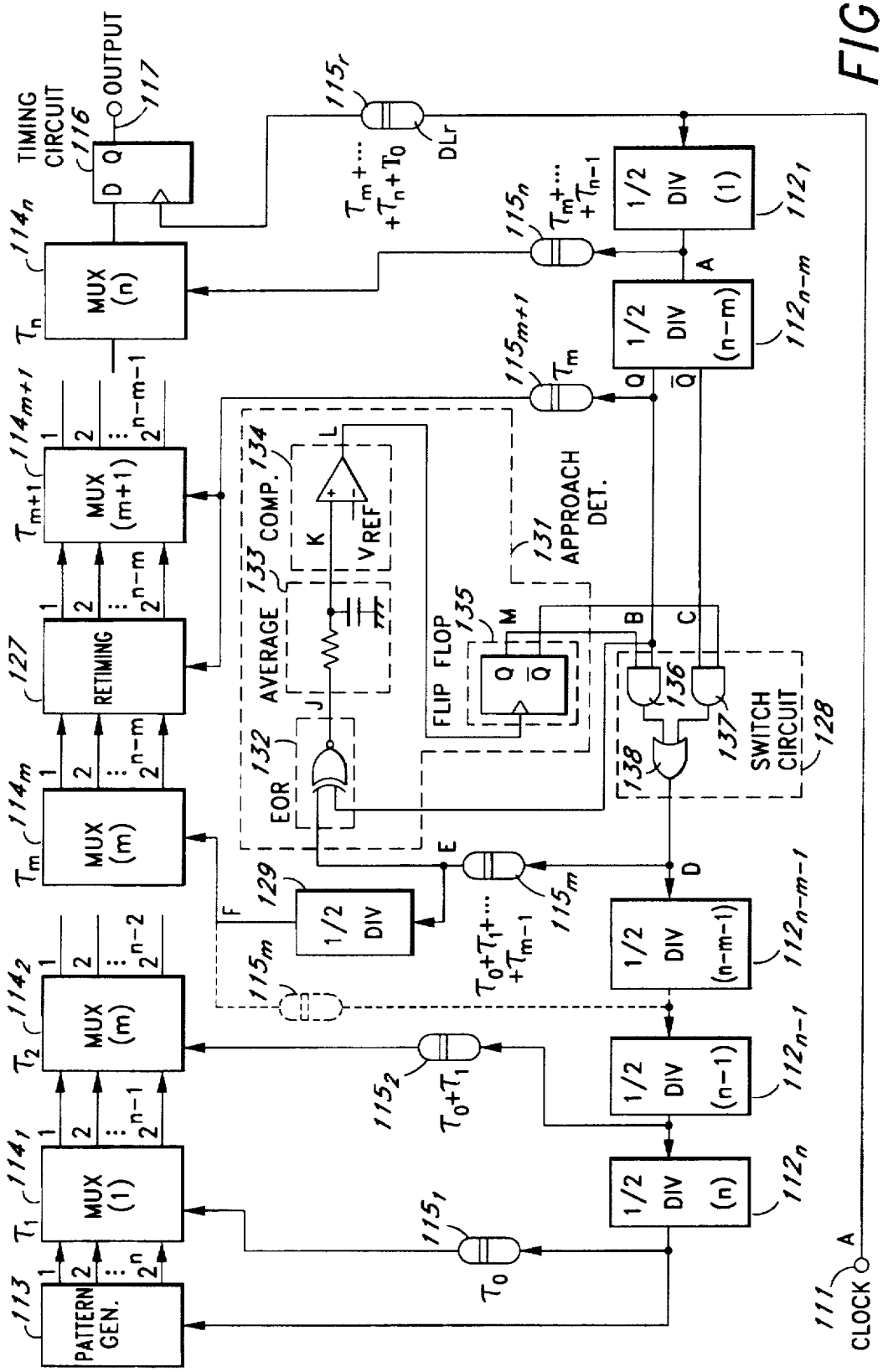
FIG. 11 is a block diagram showing a conventional wide band pulse pattern generator concerning the second invention.

This control operation is explained with reference to an internal structure of the clock frequency difference detector 150 in FIG. 9 and a timing chart of FIG. 10.

The frequency difference detector 150 measures a frequency of the input clock 111 for every fixed time period, and compares the measured data with the original frequency value. If the frequency change is greater than a predetermined value, the phase switch enable signal $160_{enb}$ is generated to enable the switch operation of the clock switch circuit 128. The clock frequency difference detector 150 is formed of a reference gate time generator 152, a pulser 153, a frequency counter 154, a count value latch register 156, a subtractor 158, a comparator 159, flip-flops 160, 161, an exclusive NOR (EXNOR) gate 162 and an AND gate 163.

The reference gate time generator 152 is a 16 bit divider to provide a reference gate time to the frequency counter 154 as a count time. The reference gate time generator 152 receives a reference clock 151 (10 MHZ for example) and divides the reference clock 151 by a predetermined division rate $152_{div}$ to repeatedly produce a divided time signal $152_{gate}$. The divided time signal $152_{gate}$ is provided to an enable terminal of the frequency counter 154 and the pulser 153. Here, the division rate $152_{div}$ is set freely by the CPU (computer) which is determined such that the 16 bit divider will not overflow in response to the frequency of the intermediate clock signal $150_{in}$ and the count value will satisfy the desired resolution (0.2% for example).

The pulser 153 is to form a pulse signal $153_{pls}$ based on the divided time signal $152_{gate}$. The pulse signal $153_{pls}$ is provided to a reset input of the frequency counter 154, clock inputs of the flip-flops 160 and 161, and one input terminal of the AND gate 163.

The frequency counter 154 is a counter for counting the intermediate speed clock signal $150_{in}$. When receiving the pulse signal $153_{pls}$, the frequency counter 154 resets to an initial value 0, then counts the number of clocks of the intermediate speed clock signal $152_{in}$ during the high level period of the divided time signal $152_{gate}$. During the period when the divided time signal $152_{gate}$ is in the low level, the counted value $152_{cnt}$ is maintained and is supplied to one input of the subtractor 158 and to the count value latch register 156.

The subtractor 158 subtracts the previous frequency value $156_{old}$ held in the count value latch register 156 from the count value $152_{cnt}$ from the frequency counter 154. The resultant subtracted value $158_{sub}$ is supplied to one input of the comparator 159.

The comparator 159 compares the subtracted value $158_{sub}$ and a comparison value $157_{cmp}$, and if the subtracted value $158_{sub}$ is greater than the comparison value $157_{cmp}$, the comparator 159 provides a high level signal to an input of the flip-flop 160. The comparison value $157_{cmp}$ is a value freely set by the CPU, and is set in advance, for example, to a value which is 2–5% different from the intermediate speed clock signal $150_{in}$.

The flip-flop 160 latches the output signal of the comparator 159 and outputs a phase switch enable signal $160_{enb}$ to one input of the AND gate 170 so as to inhibit the operation of the clock switch circuit 128. When the phase switch enable signal is in the high level, the system is in the adjustment state and thus operation of the clock switch circuit 128 is allowed. When the phase enable signal is in the low level, the system is in the measurement state, and thus the operation of the clock switch circuit 128 is prohibited.

To renew the count value latch register 156, a load pulse signal $156_{ld}$ is produced by the flip-flop 161, the exclusive OR gate 162 and the AND gate 163. More particularly, the flip-flop 161 shifts the signal from the flip-flop 160 to hold the phase switch enable signal $160_{enb}$ of the previous cycle. Both of the phase switch enable signals are input to the exclusive OR gate 162 so as to determine whether there is any change between the present and previous signals. The output of the exclusive OR gate 162 is provided to the count value latch register 156 through the AND gate 163. Thus, the count value $154_{cnt}$ is renewed and held in the count value latch register 156 as data for the next comparison.

As in the foregoing, by setting the division value $152_{div}$ and the comparison value $152_{cmp}$ to appropriate values, when the rate of frequency change of the input clock 111 is detected to be smaller than the predetermined value (for example, 2–5% frequency ratio), the switch operation of the clock switch circuit 128 is automatically enjoined. As a consequence, a stable wide band pulse pattern generator is accomplished by effectively preventing the unstable operation in the measurement state.

Other embodiments of the second invention are shown in the following.

In the foregoing explanation of the embodiment, the input clock signal for the clock frequency difference detector 150 is obtained by the divided clock taken from a ½ divider circuit $112_{n-m}$ as the intermediate speed clock signal $150_{in}$. Since it is only necessary to count the input clock 111, it is also possible to directly count the input clock 111. Alternatively, to receive the clock signal from the other ½ divider by setting the division value $152_{div}$ accordingly.

In the foregoing explanation of the embodiment, the internal structure of the clock frequency difference detector 150 is formed of the above described components, it is also possible to use other circuit structure and components to establish the equivalent circuit of the clock frequency difference detector.

Further, it may be preferable to provide an indicator on a display panel to show the state of the phase enable switch signal $160_{enb}$ which shows the output state of the flip-flop 160.

In the foregoing explanation of the embodiment, the control of the permission/prohibition of the switching operation of the clock switch circuit 128 is carried out solely by the clock frequency difference detector 150. However, in addition to this function, an additional control function such as a manual input is also possible to forcibly permit/prohibit the operation of the clock switch circuit 128.

An embodiment in accordance with the third invention is described in the following.

As explained below, this embodiment relates to a bit error measurement system which specifies and records the position of test patterns which caused a bit error.

First, the explanation of the invention for the serial process is given in the following:

This embodiment of the invention is an example which processes in a unit of one bit. This example is added with a memory function which stores the address information of the reference pattern generator at the time when the bit error is produced.

Figure 12:
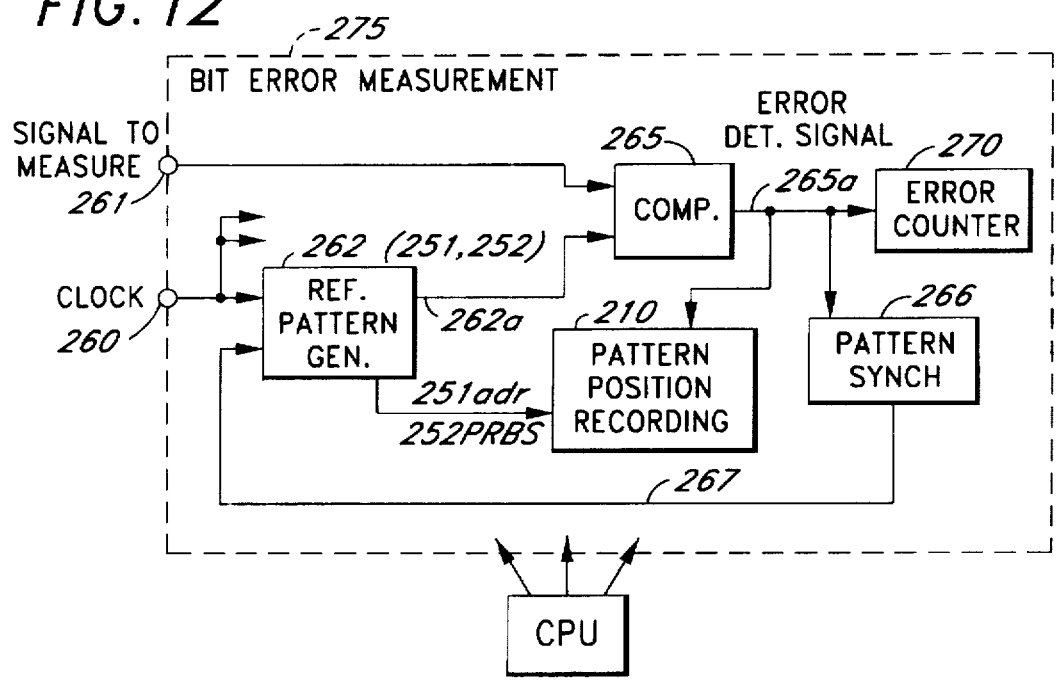
FIG. 12 is a block diagram showing an example of a structure of a bit error measurement apparatus used for a serial process.

The configuration of the measurement system is, as shown in FIG. 12, a pattern position recording part 210 is added to the conventional configuration.

The reference pattern generator 262 includes two kinds of pattern generators based on the requirement of pattern generation modes. One is a word pattern generator 251 using a memory and the other is a PRBS pattern generator 252 for generating pseudo random patterns.

Figure 13A:
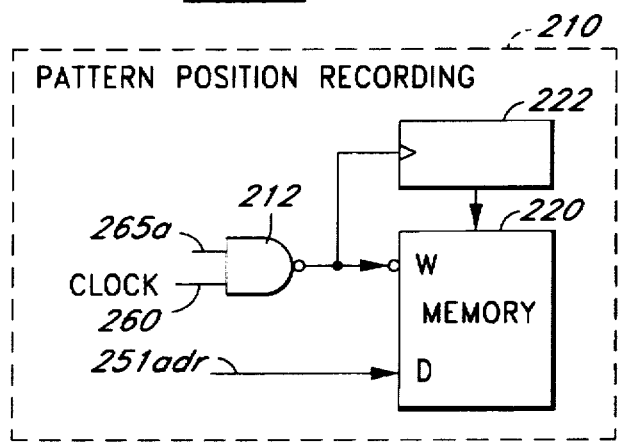
FIG. 13(a) is a block diagram showing a structure of a pattern position recording part 210 corresponding to the serial process of a word pattern generator according to the third invention.

FIG. 13(a) is a block diagram showing a structure of the pattern position recording part 210 corresponding to the word pattern generator 251. The pattern position recording part 210 has a gate 212, an address counter 222 and a memory 220.

In the case of using the word pattern generator 251, the address information is a address signal $251_{adr}$ itself for the word pattern generator 251. This address signal $251_{adr}$ (for example, 18 bit length) is provided to a data input of the memory 220.

In receiving a bit error signal $265_a$ from the comparator 265, the error signal is formatted to a pulsed signal by a clock 260 at the gate 212 and is provided to a write enable input of the memory 220. As a consequence, for every bit error, the address information of the pattern position in the word pattern generator 251 is stored in the memory 220.

Figure 14:
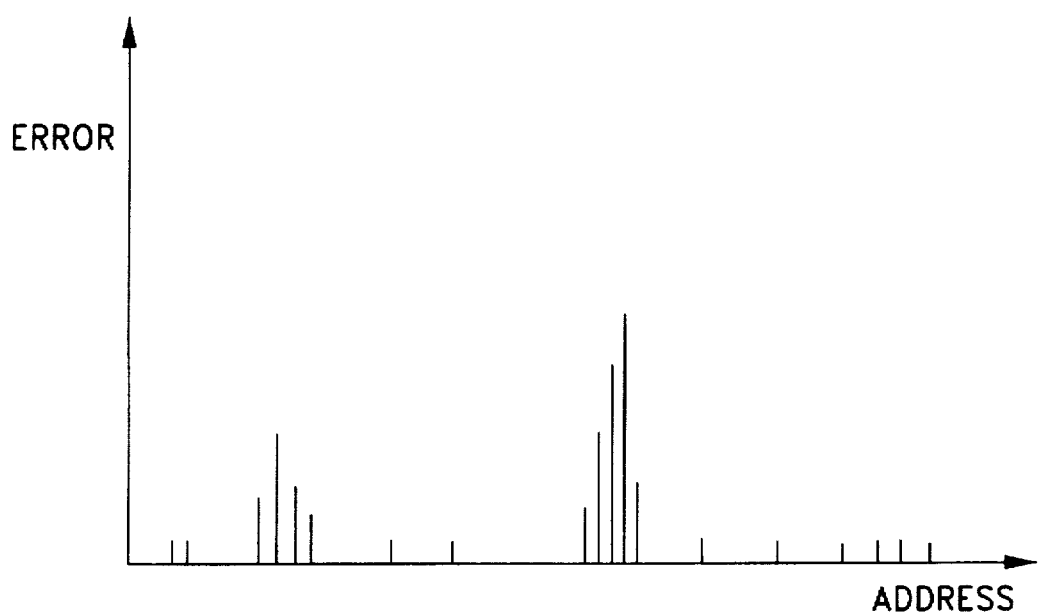
FIG. 14 is a histogram showing error distribution concerning the third invention.

After acquiring the address information, the CPU reads the contents in the memory 220 and displays address caused the bit errors in various display modes. For example, the error distribution for every fixed address interval is shown in a histogram form of FIG. 14 so that the error analysis, such as to determine as to which position of the reference pattern $262_a$ has caused the error, is easily carried out.

Figure 13B:
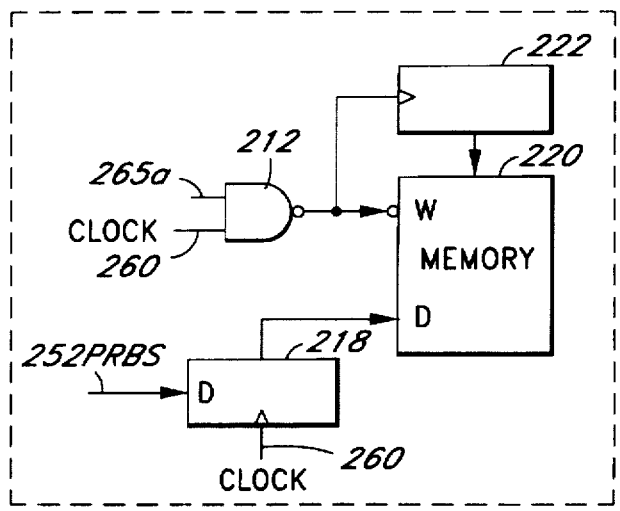
FIG. 13(b) is a block diagram showing a structure of a pattern position recording part 210 corresponding to the serial process of a PRBS pattern generator according to the third invention.

FIG. 13(b) is a block diagram showing a structure of the pattern position recording part 210 corresponding to the PRBS pattern generator 252. The pattern position recording part 210 has a gate 212, a shift register 218, an address counter 222 and a memory 220.

In the case of using the PRBS pattern generator 252, one bit is not enough to show the information of the pattern position of the reference pattern. Thus, in receiving a bit stream $265_{prbs}$ of the PRBS pattern sequence, the bit stream is converted to n bit parallel data which is deemed to be address information and is provided to a data input of the memory 220. The length of the address information in this case needs a length corresponding to the number of stages in the PRBS. For example, in case where the PRBS has 31 maximum stages, the parallel bit length of the address information must be n=31.

Therefore, in receiving a bit stream $265_{prbs}$ of the PRBS pattern sequence, the shift register 218 converts the bit stream to 31 bit parallel data. This parallel information is provided to the data input of the memory 220. The remaining operation of the pattern position recording part 210 is the same as described with respect to that of the word pattern generator 251.

Figure 15:
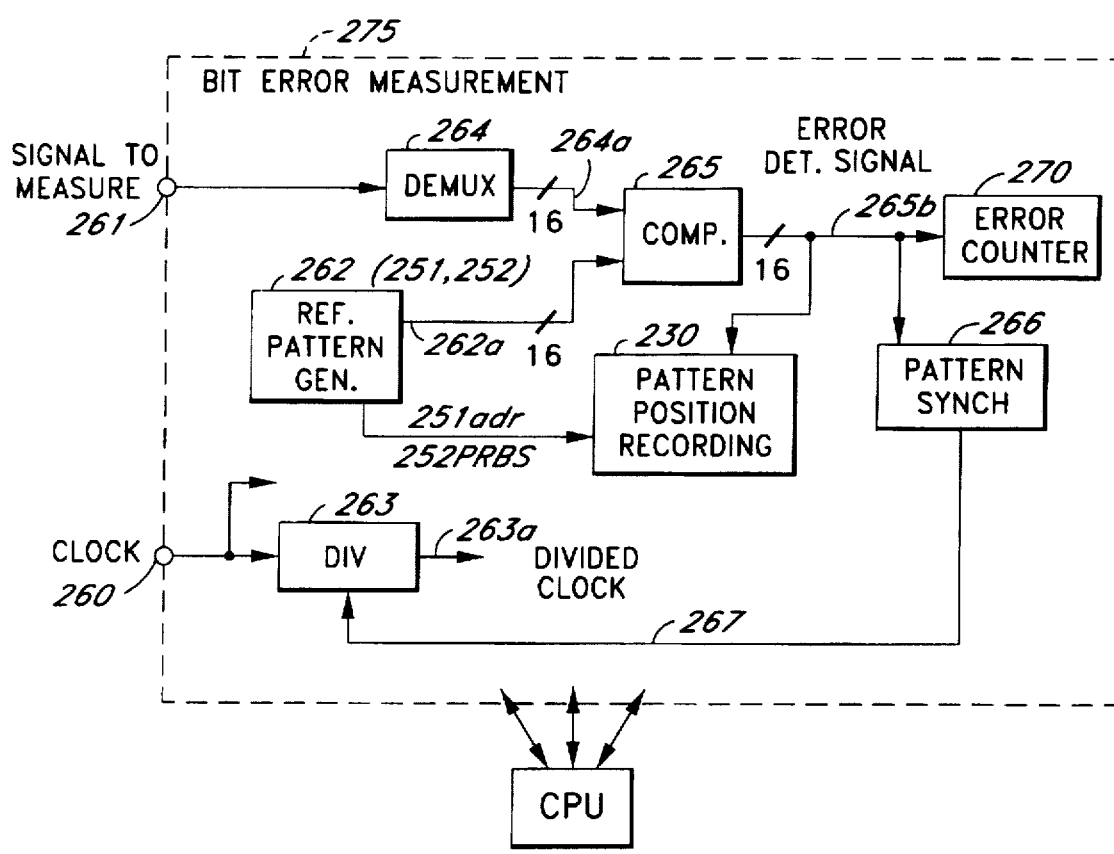
FIG. 15 is a block diagram showing an example of a structure of a bit error measurement apparatus according to the third invention used for a parallel process.

Next, the explanation of the invention for the parallel process is given in the following:

FIG. 15 shows a structure of the bit error measurement apparatus for the parallel process when N=16 bits. In this case, the signal 261 to be measured which is an ultra high speed signal is converted to a low speed parallel signal before the measurement of the bit error rate. The principle of operation is the same as that of the serial process. In this configuration, a demultiplexes 264 and a divider 263 are added to the configuration of the above noted serial process.

Figure 16A:
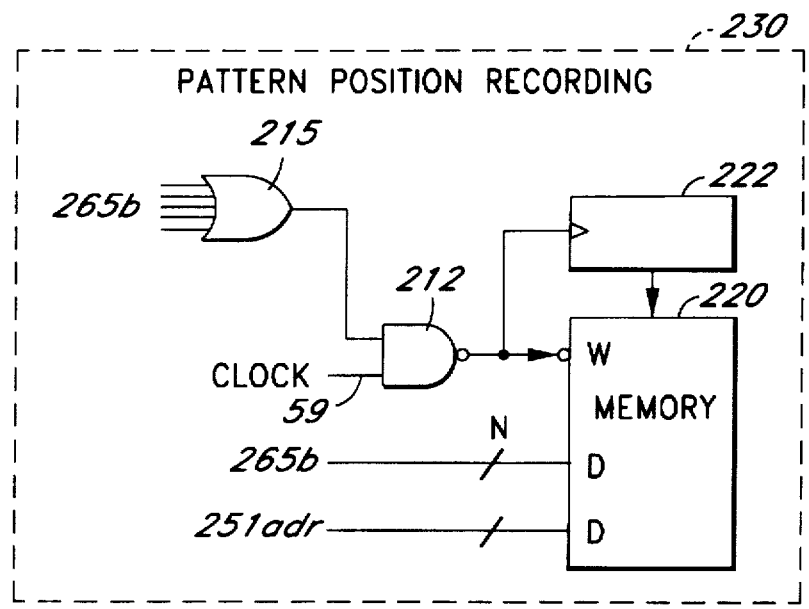
FIG. 16(a) is a block diagram showing a structure of a pattern position recording part 230 corresponding to the parallel process of the word pattern generator according to the third invention.

As shown in FIG. 16(a), a pattern position recording part 230 for the word pattern generator 251 is basically the same as explained in the above with respect to the serial process. Therefore, if an OR gate 215 detects an error in any bit out of the parallel 16 bits of the bit error detection signal $265_b$, a gate 212 produces a write enable pulse. A divided clock $263_a$ is a clock produced by dividing the clock 260. The bit error detection signal $265_b$, which is a 16 bit parallel signal is directly provided to a data input of a memory 220. Also, the address signal $251_{adr}$ of the word pattern generator 251 is provided to a data input of the memory 220. Thus, both data are stored in the memory 220. The other operations are the same as that of the serial process.

Figure 16B:
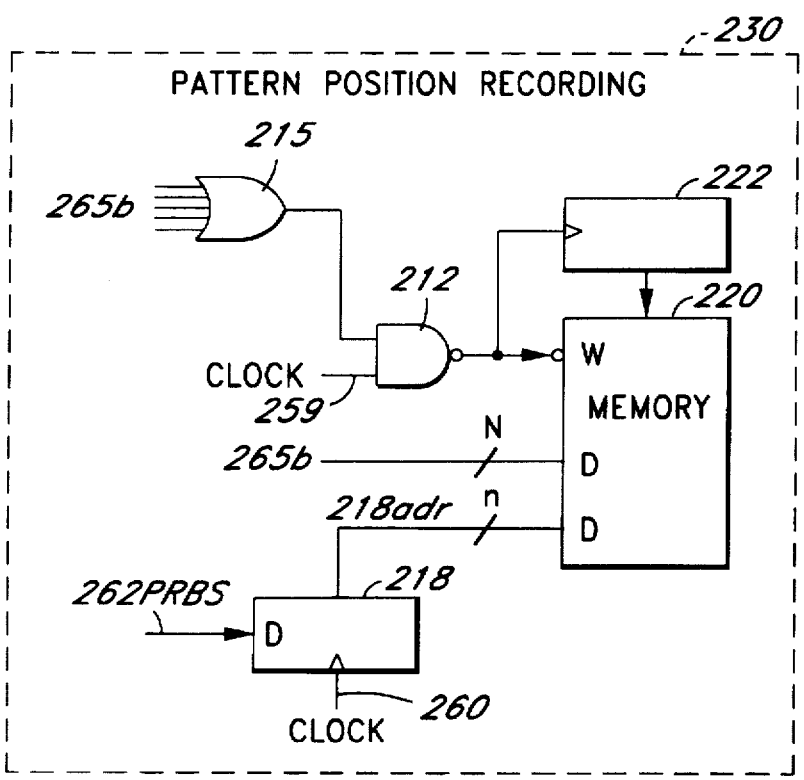
FIG. 16(b) is a block diagram showing a structure of a pattern position recording part 230 corresponding to the parallel process of the PRBS pattern generator according to the third invention.
Figure 17:
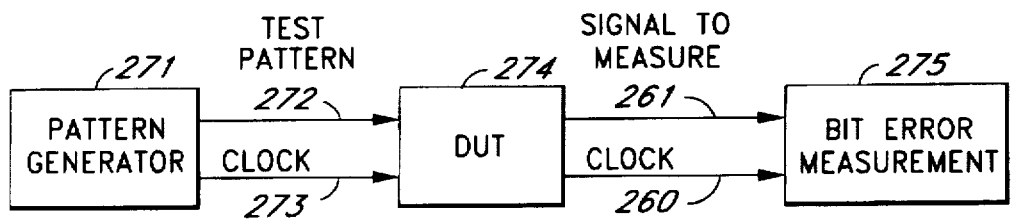
FIG. 17 shows an example of a test arrangement for using a bit error measurement system concerning the third invention.
Figure 18A:
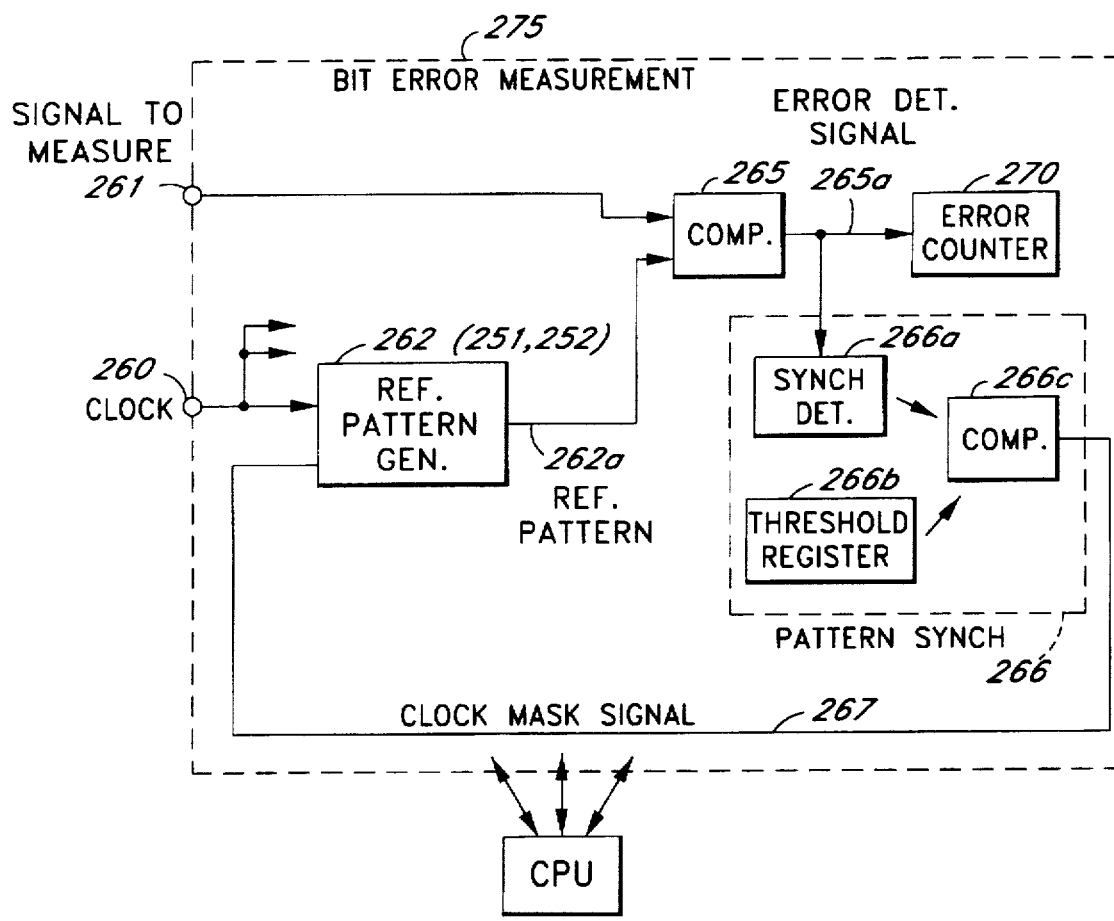
FIG. 18(a) is a block diagram showing an example of a conventional bit error measurement apparatus concerning the third invention.
Figure 18B:
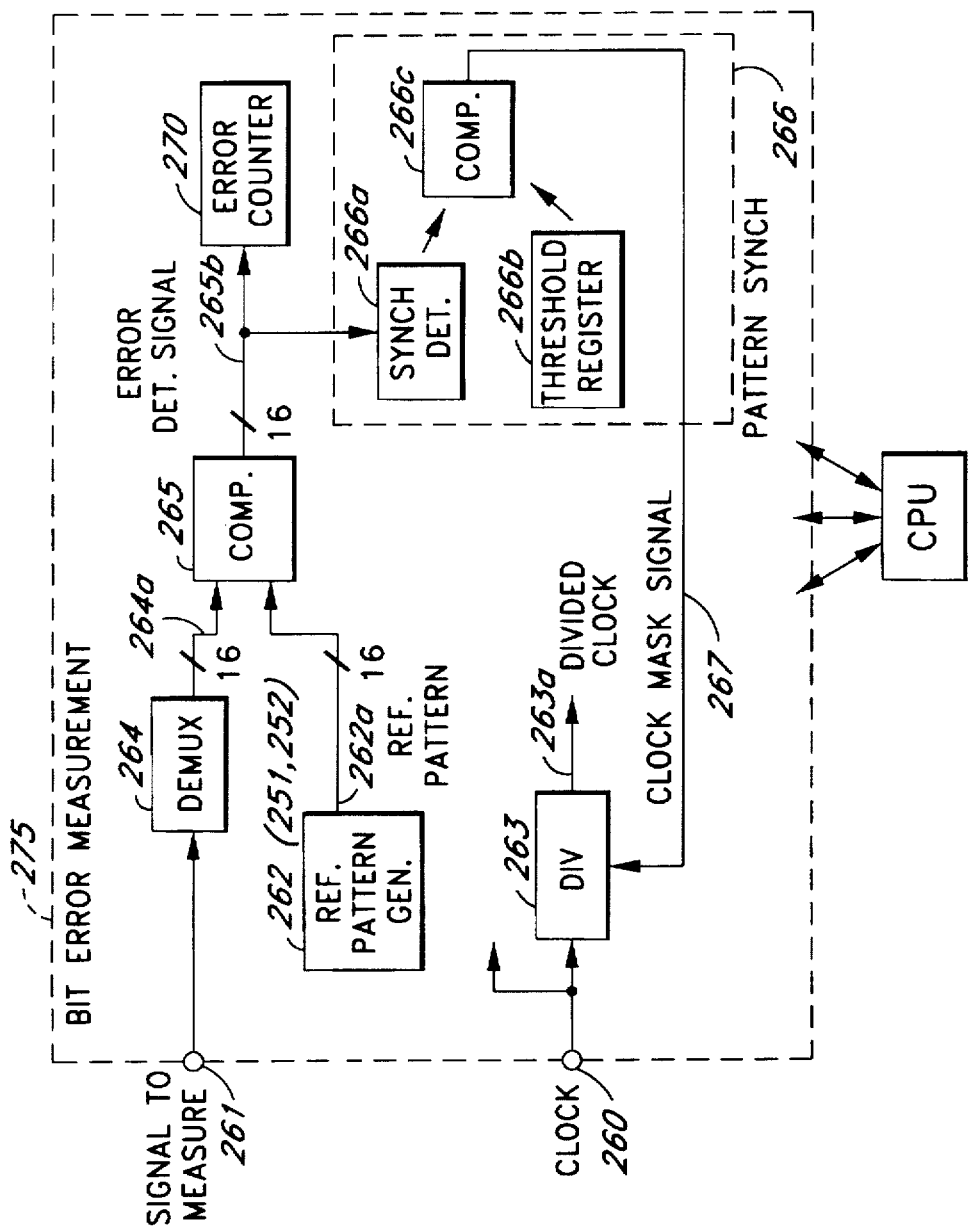
FIG. 18(b) is a block diagram showing an example of a conventional bit error measurement apparatus used in a parallel process concerning the third invention.
Figure 19:
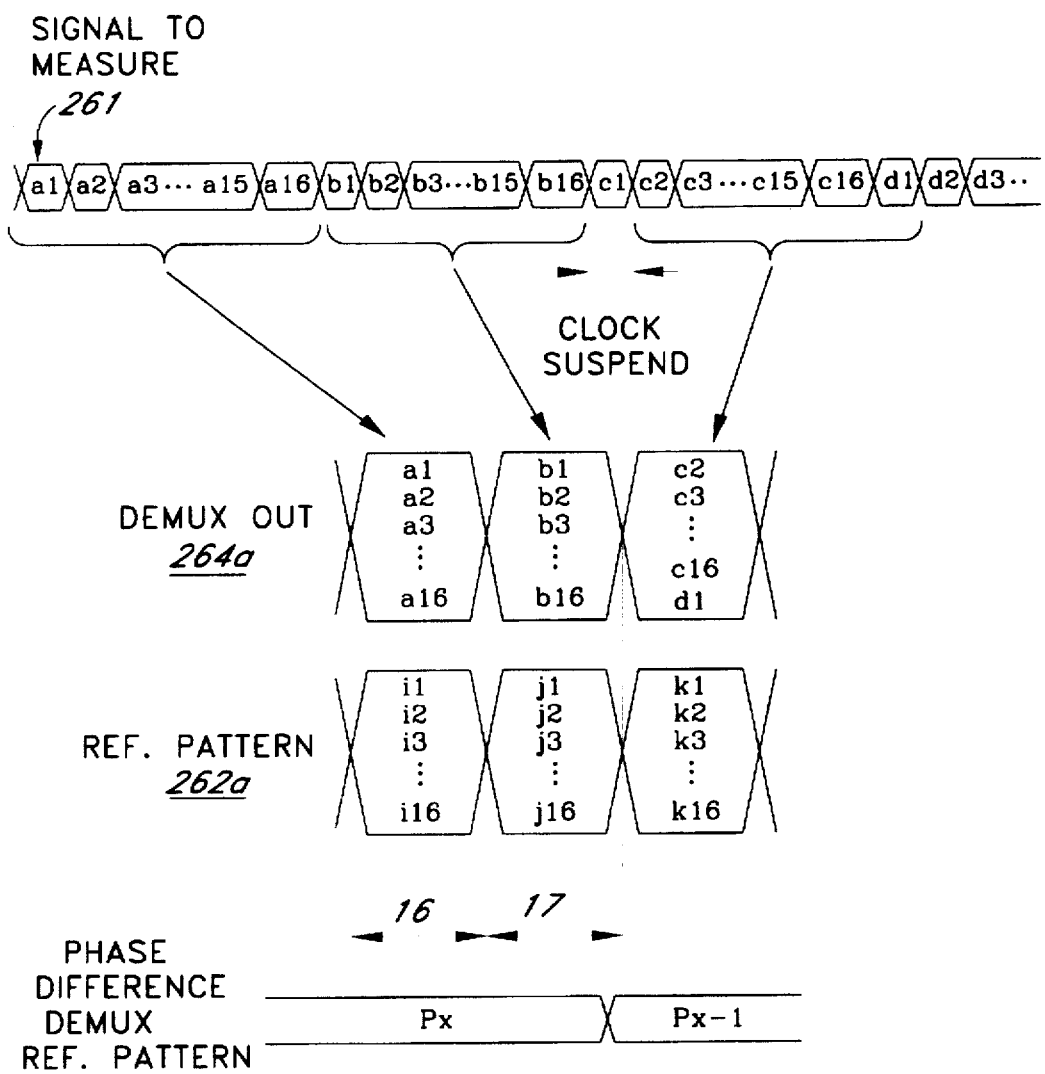
FIG. 19 is a diagram showing relationship between a DEMUX $264_a$ and a reference pattern signal $262_a$ concerning the third invention.

As shown in FIG. 16(b), when the pattern generator is the PRBS pattern generator 252, a pattern position recording part 230 needs to store the PRBS address $218_{adr}$ which is the maximum address length, i.e., n=31 bits, for example, in the memory 220. Thus, the pattern position recording part 230 includes a shift register 218. Other operations are the same as in the serial process.

Industrial Applicability

Since the present invention is configured as in the foregoing, it has the following effects:

The effects of the first invention is as follows:

This invention includes the bit error test pattern generator/ bit error measurement apparatus which is able to switch between specific patterns and random patterns in real time and analyze the bit errors in the output signal from the device under test.

The pattern generation controller 10 in the bit error test pattern generator 20 controls to alternately switch the two pattern generators in real time. The pattern generator which is not outputting the pattern is in the standby state in temporarily waiting for the next pattern generation. As a result, the invention accomplishes to generate the multiplexed patterns.

The reference pattern generator 34 generates the patterns for the comparison which are the expected patterns and are the same as the patterns generated by the pattern generators in the bit error test pattern generator 20. By receiving each clock mask signal from the word pattern synchronization part 31 and the PRBS pattern synchronization part 32, test patterns are generated which are in synchronism with the received signal 61 when the apparatus is in the synchronization state.

The word pattern synchronization part 31 receives the select signal $16_{sel}$ from the pattern generation controller 10, and determines whether the patterns are in the synchronization state in a period $T_{oh}$ for generating a word pattern. If the error rate is greater than a predetermined value, the word pattern synchronization part provides a clock mask signal $31_{inh}$ to the word pattern generator $62_{word}$ so as to bring the word pattern generator into the synchronization state.

Similarly, the PRBS pattern synchronization part 32 receives the select signal $16_{sel}$ from the pattern generation controller 10, and determines whether the patterns are in the synchronization state in a period $T_{payload}$ for generating a PRBS pattern. If the error rate is greater than a predetermined value, the word pattern synchronization part 32 provides a clock mask signal $32_{inh}$ to the PRBS pattern generator $62_{prbs}$ so as to bring the PRBS pattern generator into the synchronization state. Namely, both of the pattern synchronization parts are able to separately, i.e., independently between the word pattern and the PRBS pattern, synchronize the patterns.

Accordingly, the bit error measurement system is achieved which is able to sequentially multiplex the parallel patterns and measure the bit errors corresponding to the multiplexed patterns.

The effects of second invention is as follows:

This invention relates to the bit error measurement system which includes a bit error pattern generator which is able to automatically switch clock edges of the clock signals to sequentially multiplex parallel patterns to form a high speed test pattern.

The AND gate 170 controls the operation of the T-type flip-flop 135 when receiving the phase switch enable signal 160enb from the clock frequency difference detector 150.

The clock frequency difference detector 150 counts the frequency of the input clock 111 and compares the counted value with the previous frequency value. If the present frequency is greater than the previous frequency by a predetermined value, the frequency difference detector 150 allows/prohibits the clock switch circuit 128 its clock phase switching operation.

By this arrangement, it is determined whether the bit error measurement system is in the adjustment state or the measurement state. If the system is in the measurement state, the clock switching operation of the clock switch circuit 128 is prohibited. Therefore, the unstable operation of the clock switch circuit 128 during the measurement state is eliminated and thus, the stable, wide band pulse pattern generator is achieved.

The effects of the third invention is as follows:

This invention relates to a bit error measurement apparatus which is capable of specifying and recording a position of the test pattern which caused the bit error.

The pattern position recording part 210 stores the information regarding the reference pattern generation of the reference pattern generator in the memory 220 when the comparator sends the error detection signal 265a. The information regarding the reference pattern position is the address of the word pattern generator when the word pattern generator 251 is used. In contrast, when using the PRBS pattern generator 252, the information regarding the reference pattern position is the n bit parallel data which has been converted from the bit stream $265_{prbs}$ of the PRBS pattern.

The pattern position recording part 230 stores the information regarding the reference pattern generation of the reference pattern generator and as well as the N bit parallel error detection signals $265_b$ in the memory so that the information on which position of the error in the N bit can be specified.

In this arrangement, according to the present invention, the position of the reference pattern $262_a$ which caused the error can be specified, which further facilitates the bit error analysis.

What is claimed is:

1. A test pattern generator to be used for a bit error measurement and has a M channel selectable pattern generator to generate selected test patterns, characterized in that said test pattern generator having:

a pattern generator having M channels for pattern generation; and a pattern generation controller (10) for controlling the pattern generation by sequentially switching each of said channels of said pattern generator in real time such that while one channel of said pattern generator is selected and generating the test pattern, the other channels are waiting for the next pattern generation.

2. A test pattern generator as defined in claim 1, wherein said pattern generator has two channels and said pattern generation controller (10) is characterized in having that:

a program counter (12) for repeatedly generating a frame period ($12_{pset}$)

two level means for generating a select signal ($16_{sel}$) which defines selection time periods of said two channels of said pattern generator through a coincidence comparator (14) which receives frame period data ($12_{dat}$) from said program counter (12); and a period counter (18) for providing a number of said frame period repeatedly generated.

3. A bit error measurement system to measure a bit error of a device and has a M channel selectable pattern generator to provide the selected test patterns to a device under test and receive the resultant signals from the device under test to measure a bit error, characterized in that said test pattern generator having:

a pattern generator having M selectable channels for pattern generation corresponding to a test pattern received signal (61);

a pattern generation controller (10) for controlling the pattern generation by sequentially generating a pattern generation period signal for switching each of said channels of said pattern generator such that while one channel of said pattern generator to be provided to a comparator (65) is selected and generating the test patter, the other channels are waiting for the next pattern generation;

switching means for selectively switching reference patterns of a reference pattern generator having M channels of pattern generation when receiving a select signal from a pattern generation controller (10) to provide said reference patterns to said comparator (65); and M channel pattern synchronization parts each of which separately detects a synchronization of said pattern and provides a clock mask signal to a corresponding pattern generator when said pattern is not in said synchronization.

4. A bit error measurement system as defined in claims 1 or 3, wherein said M channels of said pattern generator include at least one word pattern generator and at least one PRBS (pseudo random binary sequence) pattern generator.

5. A bit error measurement system as defined in claims 1 or 3, wherein said word pattern generator ($62_{word}$) generates word patterns by reading out contents in a memory.

6. A bit error measurement system as defined in claims 1 or 3, wherein said PRBS (pseudo random binary sequence) pattern generator ($62_{word}$) generates pseudo random patterns.

7. A bit error measurement system characterized in having that:

a wide band pattern generation circuit for sequentially multiplexing parallel patterns generated by a pattern generator circuit (113) to form a high speed pattern, said wide band pattern generation circuit having an approach detection circuit (131), a clock switch circuit (128), an intermediate retiming circuit (127) and a clock edge switch circuit which cancels delay times ($\tau_0 + \tau_1 + .. + \tau_{m-1}$) in said intermediate retiming circuit; and a clock frequency difference detector (150) provided in said wide band pattern generation circuit for counting a frequency of an input clock (111) to detect whether the counted frequency exceeds a predetermined difference from the frequency at a previous phase switching to determine either permit or prohibit a phase switch operation in said clock switch circuit (128).

8. A bit error measurement system as defined in claim 7, wherein said clock frequency difference detector (150) includes:

means for counting a frequency ($f_{clk}$) of an input clock to be used for multiplexing said patterns;

means for permitting an automatic switching operation of said clock switch circuit (128), by judging that the bit error measurement system is in a adjustment state, when detecting a frequency difference which is greater than a predetermined value by comparing said frequency ($f_{clk}$) and a previously measured frequency ($156_{old}$), and for prohibiting said automatic switching operation of said clock switch circuit (128), by judging that the bit error measurement system is in a measurement state, when said frequency difference is smaller than said predetermined value; and means for holding said previously measured frequency ($156_{old}$) taken at a time when said automatic switching operation is taken place.

9. A bit error measurement system having a reference pattern generator (262), a comparator (265), a pattern synchronization part (266) and an error counter (270) for measuring bit errors of a signal (261) under test characterized in that:

said bit error measurement system has a pattern position recording part which stores address information of said reference pattern generator (262) in memory means when receiving an error detection signal ($265_a$) from said comparator (265).

10. A bit error measurement system having a reference pattern generator (262), a comparator (265), a pattern synchronization part (266) and an error counter (270) for measuring bit errors of a signal (261) under test for every N bit parallel characterized in that:

said bit error measurement system has a pattern position recording part which stores address information of said reference pattern generator (262) when receiving an error signal in any one of N bit error detection signals ($265_a$) from said comparator (265) and said N bit error detection signals ($265_a$) in memory means.

11. A bit error measurement system as defined in claims 9 or 10, wherein said reference pattern generator is either a word pattern generator or a PRBS pattern generator or a combination of both of said pattern generators.

* * * * *